US012684928B2

(12) United States Patent
Zhang et al.

(10) Patent No.: US 12,684,928 B2
(45) Date of Patent: Jul. 14, 2026

(54) LIGHT-EMITTING CHIP, MANUFACTURING METHOD THEREOF AND ELECTRONIC DEVICE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 453 days.

(21) Appl. No.: 18/345,311

(22) Filed: Jun. 30, 2023

(65) Prior Publication Data

US 2024/0006464 A1 Jan. 4, 2024

(30) Foreign Application Priority Data

Jul. 1, 2022 (CN) ......................... 202210768193.X

(51) Int. Cl.
*H10H 29/14* (2025.01)

(52) U.S. Cl.
CPC .................................. *H10H 29/142* (2025.01)

(58) Field of Classification Search
CPC .. H10H 29/142; H10H 20/825; H10H 20/819; H10H 20/835; H10H 20/8312; H10H 20/841; H10H 20/018; H10H 20/814; H10H 20/812; H10H 20/821
See application file for complete search history.

(56) References Cited

U.S. PATENT DOCUMENTS

| | | | | |
|---|---|---|---|---|
| 2002/0134987 A1* | 9/2002 | Takaoka | ............... | H10H 20/819 |
| | | | | 257/98 |
| 2020/0075634 A1* | 3/2020 | Sim | ........................ | H10D 86/60 |
| 2020/0395521 A1* | 12/2020 | Brodoceanu | ........... | H10H 20/01 |

FOREIGN PATENT DOCUMENTS

DE 1744375 * 6/2006

OTHER PUBLICATIONS

Machine translation of EP-1744375 (Year: 2006).*

* cited by examiner

*Primary Examiner* — Yasser A Abdelaziez
(74) *Attorney, Agent, or Firm* — Westbridge IP LLC

(57) ABSTRACT

Disclosed are a light-emitting chip, a manufacturing method thereof and an electronic device. The light-emitting chip includes a first substrate; and at least one reflector and a light-emitting pixel layer sequentially located on the first substrate. The light-emitting pixel layer includes at least one light-emitting pixel. The reflector is arranged corresponding to the light-emitting pixel. A first surface, close to the light-emitting pixel, of the reflector is a bowl-shaped surface. The bowl-shaped surface is concave in a direction close to the first substrate. The reflector is configured to reflect light emitted by a corresponding light-emitting pixel and adjust an emission direction and/or an emission angle of the light, so that the light exit rate of the light-emitting chip can be improved, and the light-emitting brightness of the light-emitting chip and electronic device can be further improved.

18 Claims, 18 Drawing Sheets

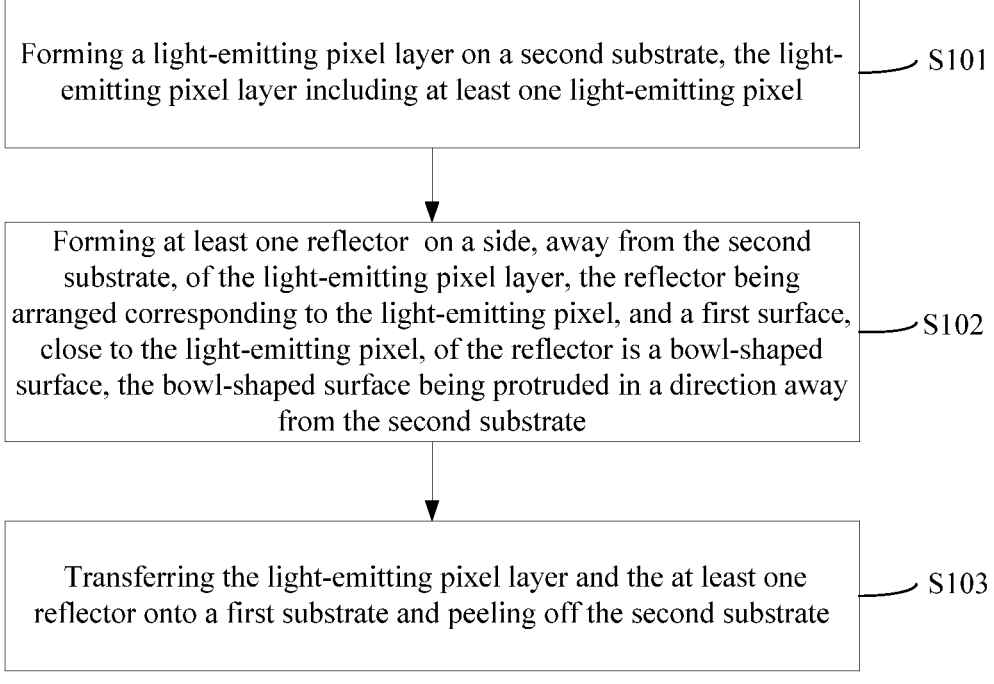

Forming a light-emitting pixel layer on a second substrate, the light-emitting pixel layer including at least one light-emitting pixel — S101

Forming at least one reflector on a side, away from the second substrate, of the light-emitting pixel layer, the reflector being arranged corresponding to the light-emitting pixel, and a first surface, close to the light-emitting pixel, of the reflector is a bowl-shaped surface, the bowl-shaped surface being protruded in a direction away from the second substrate — S102

Transferring the light-emitting pixel layer and the at least one reflector onto a first substrate and peeling off the second substrate — S103

FIG. 14

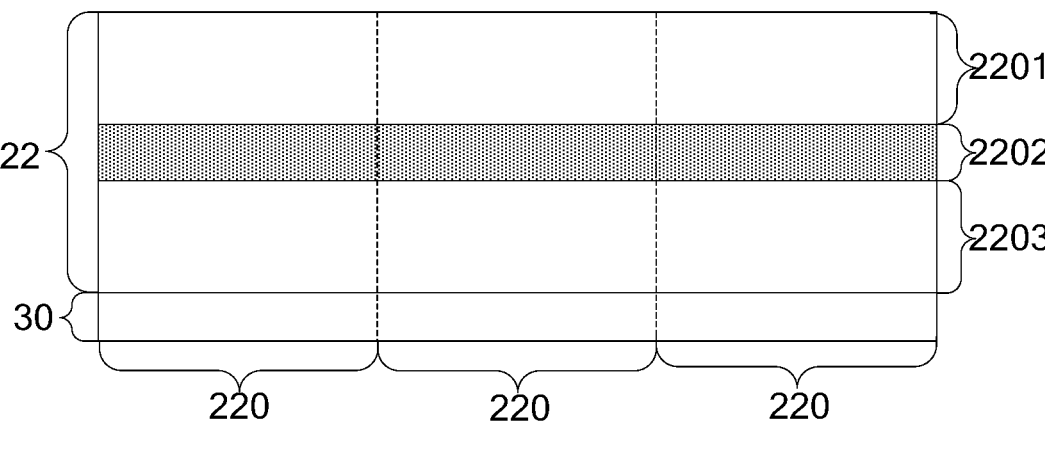

FIG. 15

LIGHT-EMITTING CHIP, MANUFACTURING METHOD THEREOF AND ELECTRONIC DEVICE

CROSS-REFERENCE TO RELATED APPLICATIONS

This disclosure claims priority to Chinese Patent Application No. 202210768193.X, filed on Jul. 1, 2022, which is incorporated herein by reference in their entirety.

TECHNICAL FIELD

The present application relates to a technical field of light emitting, in particular to a light-emitting, a manufacturing method thereof and an electronic device.

BACKGROUND

A micro light-emitting chip is a light-emitting chip integrated with a high-density array of light-emitting pixels (such as light-emitting diodes). Due to its advantages of high resolution, high integration, low power consumption, small size, and light weight, the micro light-emitting chip has been widely used in many display fields such as near-eye display and wearable display. However, the light-emitting brightness of current micro light-emitting chip is low, which is not conducive to their application.

SUMMARY

Objectives of this application are to provide a light-emitting chip, a manufacturing method thereof, and an electronic device to solve a problem of low light-emitting brightness of a device.

In a first aspect, the present application provides a light-emitting chip, including a first substrate; and at least one reflector and a light-emitting pixel layer sequentially located on the first substrate. The light-emitting pixel layer includes at least one light-emitting pixel, where the light-emitting pixel includes a first semiconductor layer, a light-emitting layer and a second semiconductor layer sequentially located on the first substrate. The reflector is arranged corresponding to the light-emitting pixel. A first surface, close to the light-emitting pixel, of the reflector is a bowl-shaped surface. The bowl-shaped surface is concave in a direction close to the first substrate. The reflector is configured to reflect light emitted by a corresponding light-emitting pixel and adjust an emission direction and/or an emission angle of the light.

Optionally, the first surface, close to the light-emitting pixel and a second surface away from the light-emitting pixel of the reflector are bowl-shaped surfaces, and the reflector is configured as a bowl-shaped structure.

Optionally, a second surface, away from the light-emitting pixel, of the reflector is a flat surface.

Optionally, a side, facing the first substrate, of the light-emitting pixel layer is provided with at least one bowl-shaped protrusion. The bowl-shaped protrusion is protruded in a direction close to the first substrate. The bowl-shaped protrusion is arranged corresponding to the reflector, and a shape of the bowl-shaped surface of the reflector is consistent with that of the bowl-shaped protrusion.

Optionally, a material of the bowl-shaped protrusion is the same as that of the first semiconductor layer.

Optionally, a material of the bowl-shaped protrusion is a transparent conductive material.

Optionally, the light-emitting chip further includes a first electrode and a second electrode. The first electrode is located on a side, away from the light-emitting pixel layer, of the reflector, and the first electrode is electrically connected with the first semiconductor layer. The second electrode is located on a side, away from the first substrate, of the second semiconductor layer, and the second electrode is electrically connected with the second semiconductor layer.

Optionally, a film layer between the first electrode and the first semiconductor layer is conductive film layer, and the first electrode is electrically connected with the first semiconductor layer through the conductive film layer; the conductive film layer at least includes the reflector.

Optionally, the first electrode is electrically connected with the first semiconductor layer through an electrical conductor, the electrical conductor penetrates a film layer located between the first electrode and the first semiconductor layer.

Optionally, a side, away from the light-emitting pixel layer, of the first electrode is provided with a driving circuit board. The first electrode is electrically connected with the driving circuit board through a first connector, and the first connector penetrates a film layer between the first electrode and the driving circuit board. The second electrode is electrically connected with the driving circuit board through a second connector, and the second connector penetrates a film layer between the second electrode and the driving circuit board.

Optionally, there is an isolation structure between adjacent light-emitting pixels, and the isolation structure is configured to isolate light of the adjacent light-emitting pixels.

Optionally, the second connector is located inside the isolation structure, and the second connector is configured to realize electrical connection between the second electrode of the light-emitting pixel and the driving circuit board.

Optionally, the reflector is arranged in one-to-one correspondence with the light-emitting pixel, and an orthographic projection, on the first substrate, of one reflector covers an orthographic projection, on the first substrate, of one light-emitting pixel.

Optionally, a plurality of reflectors are arranged corresponding to one light-emitting pixel, and orthographic projections, on the first substrate, of the plurality of reflectors cover an orthographic projection, on the first substrate, of one light-emitting pixel.

In a second aspect, the present application provides a manufacturing method of a light-emitting chip, including: forming a light-emitting pixel layer on a second substrate, the light-emitting pixel layer including at least one light-emitting pixel, and the light-emitting pixel including a second semiconductor layer, a light-emitting layer and a first semiconductor layer sequentially located on the second substrate; forming at least one reflector on a side, away from the second substrate, of the light-emitting pixel layer, the reflector being arranged corresponding to the light-emitting pixel, and a first surface, close to the light-emitting pixel, of the reflector is a bowl-shaped surface, the bowl-shaped surface being protruded in a direction away from the second substrate; and transferring the light-emitting pixel layer and the at least one reflector onto a first substrate and peeling off the second substrate, where the at least one reflector and the light-emitting pixel layer are sequentially located on the first substrate, and the light-emitting pixel includes the first semiconductor layer, the light-emitting layer and the second semiconductor layer sequentially located on the first substrate, the bowl-shaped surface is concave in a direction close to the first substrate; the reflector is configured to reflect light emitted by a corresponding light-emitting pixel and adjust an emission direction and/or an emission angle of the light.

Optionally, the forming at least one reflector on a side, away from the second substrate, of the light-emitting pixel layer includes: forming at least one bowl-shaped protrusion on the side, away from the second substrate, of the light-emitting pixel layer, and the bowl-shaped protrusion being protruded in a direction away from the second substrate; and forming the at least one reflector on a surface of the at least one bowl-shaped protrusion, and a shape of the bowl-shaped surface of the reflector is consistent with that of the bowl-shaped protrusion.

Optionally, the forming at least one bowl-shaped protrusion on a side, away from the second substrate, of the light-emitting pixel layer includes: forming a transparent conductive layer on the side, away from the second substrate, of the light-emitting pixel layer, and etching the transparent conductive layer, to form at least one first bowl-shaped protrusion.

Optionally, the forming at least one bowl-shaped protrusion on a side, away from the second substrate, of the light-emitting pixel layer includes: etching the first semiconductor layer on the side, away from the second substrate, of the light-emitting pixel layer, to form at least one second bowl-shaped protrusion.

In a third aspect, the present application provides an electronic device including the light-emitting chip as described in any one of the above aspects.

Optionally, the electronic device includes a near-eye display device, and the near-eye display device includes a near-eye display or augmented reality glasses.

BRIEF DESCRIPTION OF THE DRAWINGS

The above and other objects, features and advantages of the present application will become more obvious by describing the embodiments of the present application in more detail with the accompanying drawings. The accompanying drawings are provided to provide a further understanding of the embodiments of the present application, and constitute a part of the specification, and together with the embodiments of the present application, serve to explain the present application, and do not constitute a limitation of the present application. In the accompanying drawings, the same reference numerals generally represent the same parts or steps.

FIG. 14 is a flowchart of a manufacturing method of a light-emitting chip according to an embodiment of the present application.

FIG. 15 to FIG. 20 are schematic cross-sectional views of a manufacturing process of a light-emitting chip according to an embodiment of the present invention.

DETAILED DESCRIPTION OF THE EMBODIMENTS

Based on the accompanying drawings disclosed in the present application, a clear and complete description of the technical solutions presented in the present embodiment will be provided. It is evident that the embodiments described herein represent only a portion of the embodiments disclosed in the present application, rather than all of them. All other embodiments obtained by those skilled in the art without any inventive effort, based on the embodiments disclosed in the present application, are within the scope of protection of the present application.

Figure 1:
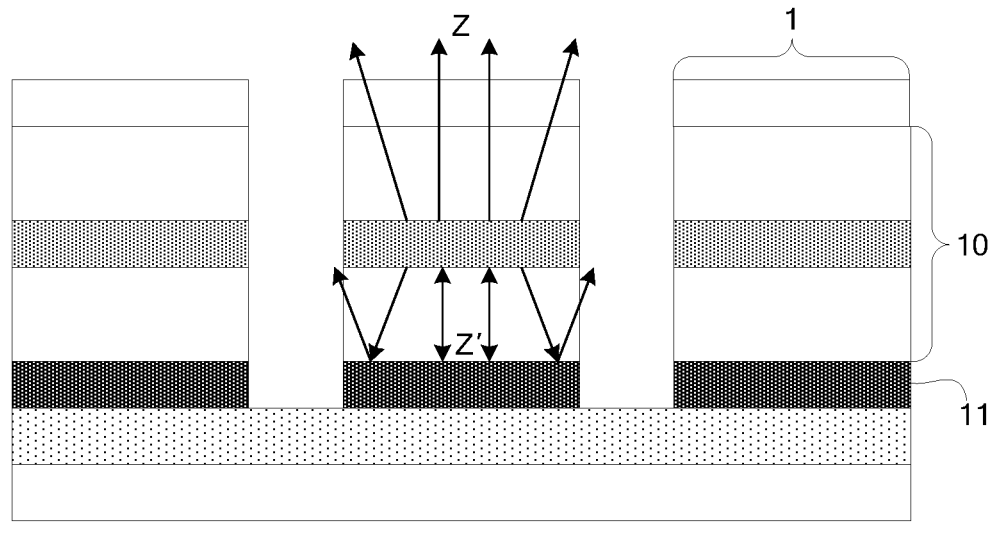
FIG. 1 is a schematic cross-sectional view of a micro light-emitting chip.

As shown in FIG. 1, FIG. 1 is a schematic cross-sectional view of a micro light-emitting chip. The micro light-emitting chip includes a light-emitting pixel layer 10, and the light-emitting pixel layer 10 includes a plurality of light-emitting pixels 1 arranged in array. The light-emitting pixel 1 emits light not only in a positive direction Z but also in a back direction Z'. Small-angle light emitted by the light-emitting pixel 1 to the backside may be reflected back to the front by setting a reflective layer 11 on a backside of the light-emitting pixel 1, but large-angle light may be emitted toward sides of the light-emitting pixel 1 after being reflected by the reflective layer 11, which leads to a lower front light exit rate of the light-emitting pixel 1 and a lower light-emitting brightness of the micro light-emitting chip.

Based on this, the present application provides a solution to improve the light-emitting brightness by setting a reflector with a bowl-shaped surface on the back of the light-emitting pixel, increasing the probability of light reflected from the reflector being emitted from the front, thereby improving the front light exit rate and the light-emitting brightness of the chip.

Figure 2:
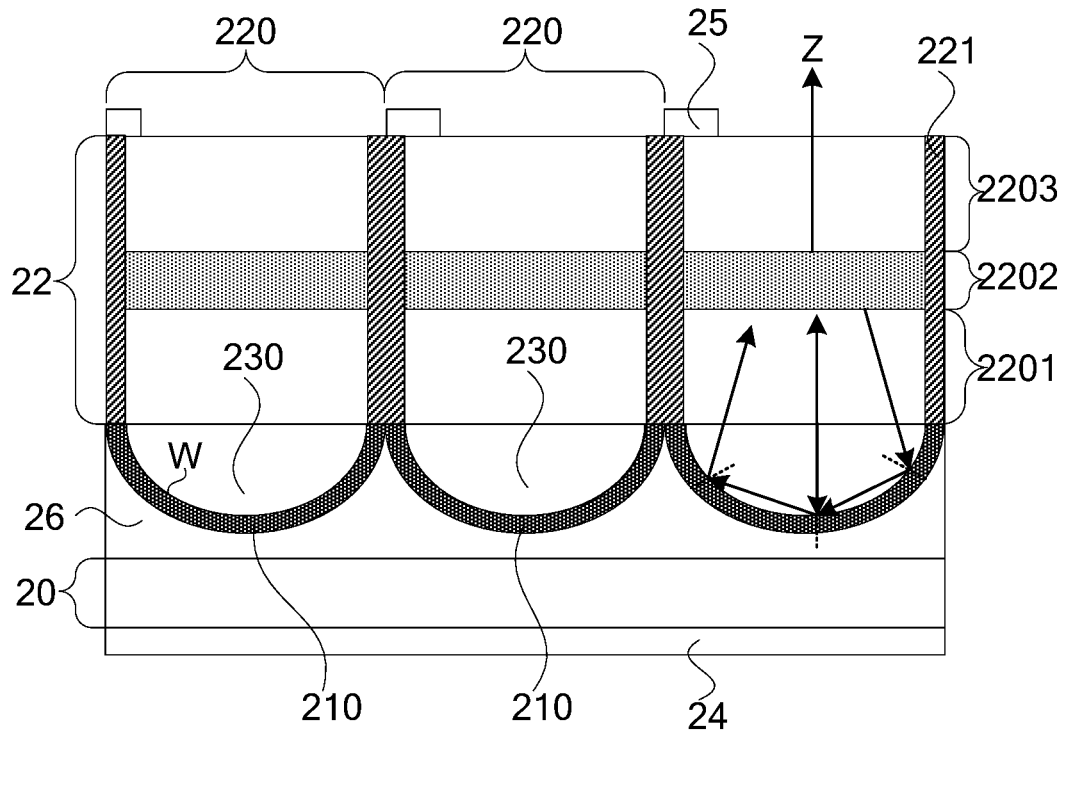
FIG. 2 is a schematic cross-sectional view of a light-emitting chip according to an embodiment of the present application.

As an alternative implementation of the present application, an embodiment of the present application provides a light-emitting chip. As shown in FIG. 2, FIG. 2 is a schematic cross-sectional view of a light-emitting chip according to an embodiment of the present application. The light-emitting chip includes a first substrate 20, and at least one reflector 210 and a light-emitting pixel layer 22 sequentially arranged on the first substrate 20.

As shown in FIG. 2, the light-emitting pixel layer 22 includes at least one light-emitting pixel 220. Each light-emitting pixel 220 includes a first semiconductor layer 2201, a light-emitting layer 2202, and a second semiconductor layer 2203 sequentially located on the first substrate 20.

The reflector 210 is arranged corresponding to the light-emitting pixel 220. A first surface, close to the light-emitting pixel 220, of the reflector 210 is a bowl-shaped surface W. The bowl-shaped surface W is concave in a direction close to the first substrate 20. The reflector 210 is configured to reflect light emitted by a corresponding light-emitting pixel 220 and adjust an emission direction and/or an emission angle of the light.

Because the first surface, close to the light-emitting pixel 220, of the reflector 210 is the bowl-shaped surface W and the bowl-shaped surface W is concave in a direction close to the first substrate 20, not only will small-angle light emitted by the light-emitting pixel 220 toward the reflector 210 be reflected to the front of the light-emitting chip by the reflector 210 and then emits out, but also large-angle light emitted by the light-emitting pixel 220 toward the reflector 210 will be reflected to the front of the light-emitting chip by the reflector 210 and then emits out, thereby improving the front light exit rate and the light-emitting brightness of the light-emitting chip. It should be noted that, as shown in FIG. 2, the light emitted from the front of the light-emitting chip refers to the light emitted from a side, away from first substrate 20, of the light-emitting pixel 220.

It should be noted that the small-angle light refers to light whose emission direction has a smaller angle with the normal of the first substrate 20, and the large-angle light refers to light whose emission direction has a larger angle with the normal of the first substrate 20.

Figure 3:
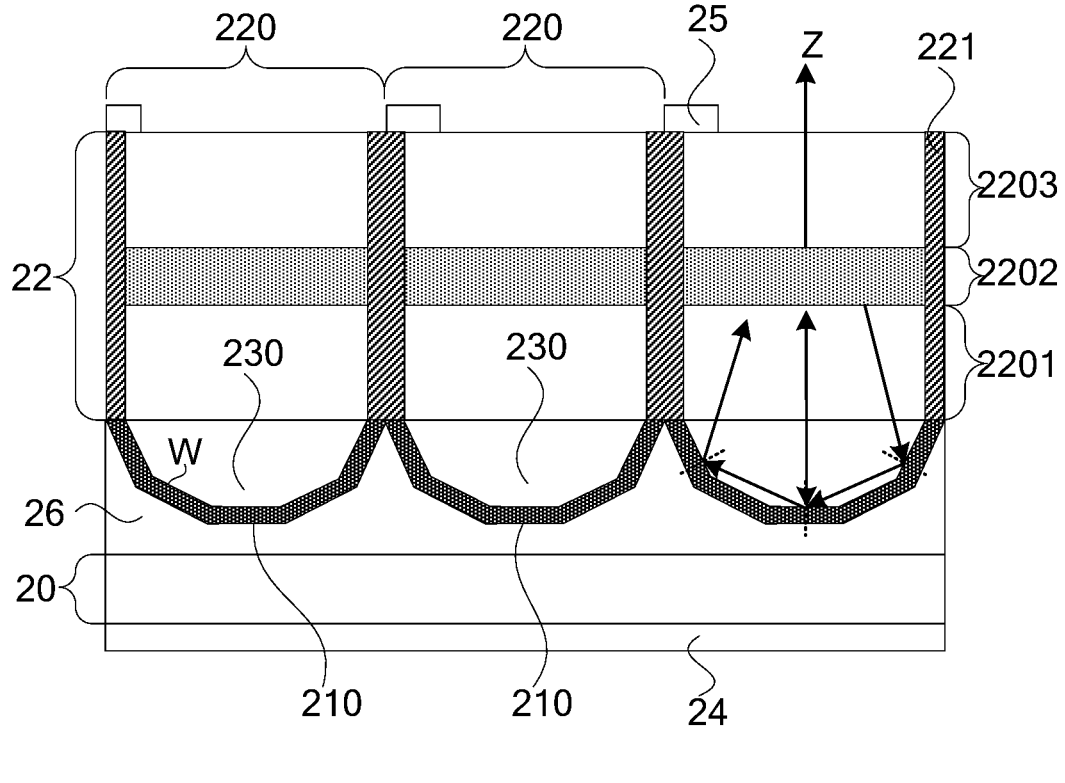
FIG. 3 is a schematic cross-sectional view of a light-emitting chip according to another embodiment of the present application.
Figure 4:
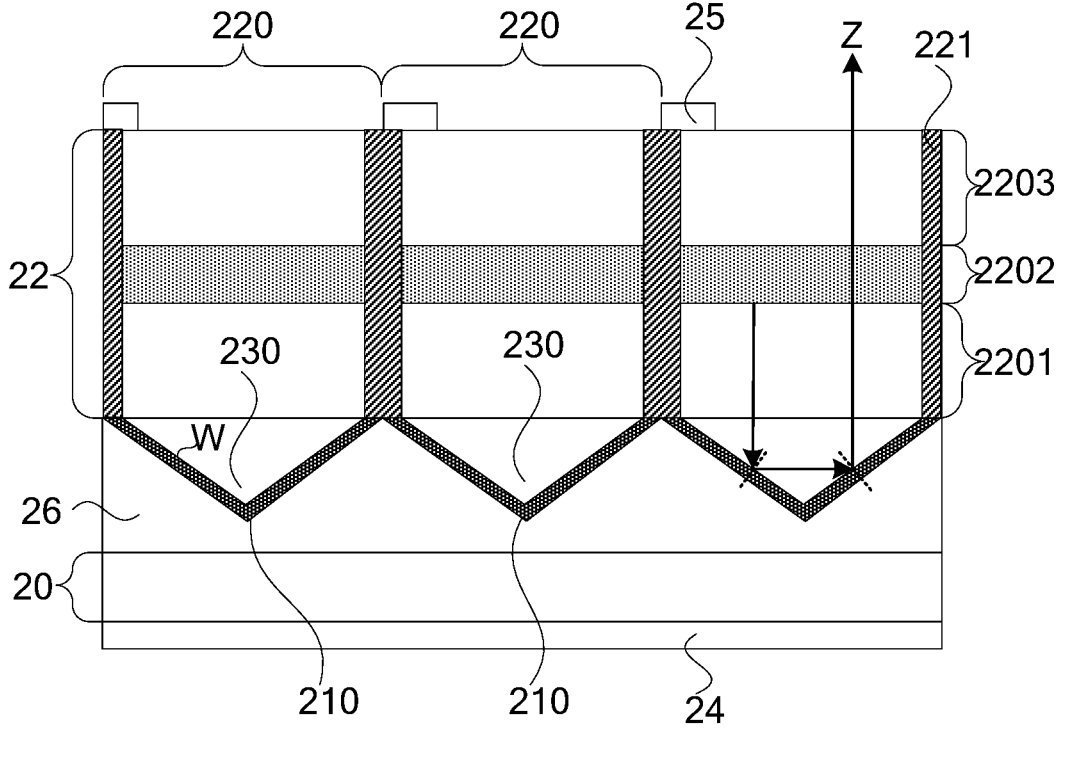
FIG. 4 is a schematic cross-sectional view of a light-emitting chip according to another embodiment of the present application.

It should be noted that, as shown in FIG. 2, the bowl-shaped surface W in the embodiment of the present application refers to a shape of a concave surface is bowl-shaped or similar to a bowl shape, a curve of the concave surface may be an arc, and the present application is not limited thereto. In some other embodiments, as shown in FIG. 3 or FIG. 4, FIG. 3 is a schematic cross-sectional view of a light-emitting chip according to another embodiment of the present application, and FIG. 4 is a schematic cross-sectional view of a light-emitting chip according to another embodiment of the present application. A curve of the concave surface in the bowl-shaped surface W may also be a broken line, etc. As shown in FIG. 3, the concave surface may be composed of a plurality broken lines to form a bowl shape, and the present application is not limited thereto. As shown in FIG. 4, a concave surface may also be composed of only two broken lines to create a sharp bowl-shaped concave surface. Specifically, the present application is not limit to the number of broken lines forming a bowl, as long as a bowl-shaped or a bowl-like concave surface is formed by the broken lines. Because the normal direction of each area of the bowl-shaped surface W is different, after the light emitted by the light-emitting pixel 220 toward the reflector 210 is reflected by the bowl-shaped surface W of the reflector 210 at least once, not only the emission direction of the light would be changed (for example, the emission direction of the light changes from facing the reflector 210 to departing from the reflector 210), but also emission angle of the light would be changed (for example, an angle between the emission direction of the light and the normal of the first substrate 20 varies from large to small or from small to large). However, because the bowl-shaped surface W is concave in the direction close to the first substrate 20, the light reflected by the bowl-shaped surface W is eventually emitted toward the front of the light-emitting chip, thus improving the front light exit rate and the light-emitting brightness of the light-emitting chip. The bowl-shaped surface W of the reflector 210 has a focusing effect on the light emitted from the light-emitting pixel 220 toward the reflector 210, reducing the light reflecting frequency within the light-emitting pixel 220, and reflecting the light to the front of the emitting chip to emit, thus improving the front light exit rate and the light-emitting brightness of the light-emitting chip.

Optionally, by adjusting the curvature of the bowl-shaped surface W, the emission direction or emission angle of light may be controlled, so that a light-emitting chip with corresponding curvature bowl-shaped surface W may be selected for different application scenarios with different requirements for emission direction or emission angle.

In an embodiment, the first semiconductor layer 2201 may be an N-type semiconductor layer, and the second semiconductor layer 2203 may be a P-type semiconductor layer. Alternatively, the first semiconductor layer 2201 may be a P-type semiconductor layer, and the second semiconductor layer 2203 may be an N-type semiconductor layer. The N-type semiconductor layer may be an N-type GaN-based semiconductor layer, or the like; the P-type semiconductor layer may be a P-type GaN-based semiconductor layer, or the like; and the light-emitting layer 2202 may be a multi-quantum well layer, or the like. The multi-quantum well layer may be a semiconductor material pair based on gallium nitride, such as GaN/InGaN, or the like.

Figure 5:
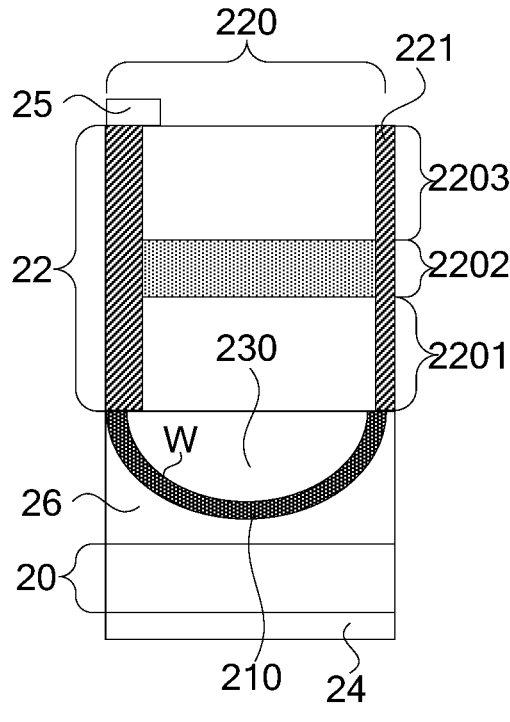
FIG. 5 is a schematic cross-sectional view of a light-emitting chip according to another embodiment of the present application.

In some embodiments, as shown in FIG. 2, the light-emitting pixel layer 22 includes a plurality of light-emitting pixels 220, and the plurality of light-emitting pixels 220 may be arranged in an array. However, the present application is not limited thereto. In other embodiments, as shown in FIG. 5, FIG. 5 is a schematic cross-sectional view of a light-emitting chip according to another embodiment of the present application, the light-emitting pixel layer 22 may only include one light-emitting pixel 220. In some embodiments of the present application, the light-emitting chip may be a micro light-emitting chip, the size of which may be less than tens of microns or even less than a few microns, such as less than 5 μm.

In some embodiments of the present application, as shown in FIG. 2 to FIG. 5, a first surface close to the light-emitting pixel 220 and a second surface away from the light-emitting pixel 220 of a reflector 210 are bowl-shaped surfaces W, and the reflector 210 is a bowl-shaped structure, so as to reflect light on the opposite surfaces of the reflector 210 to further improve the reflectivity of light.

Figure 6:
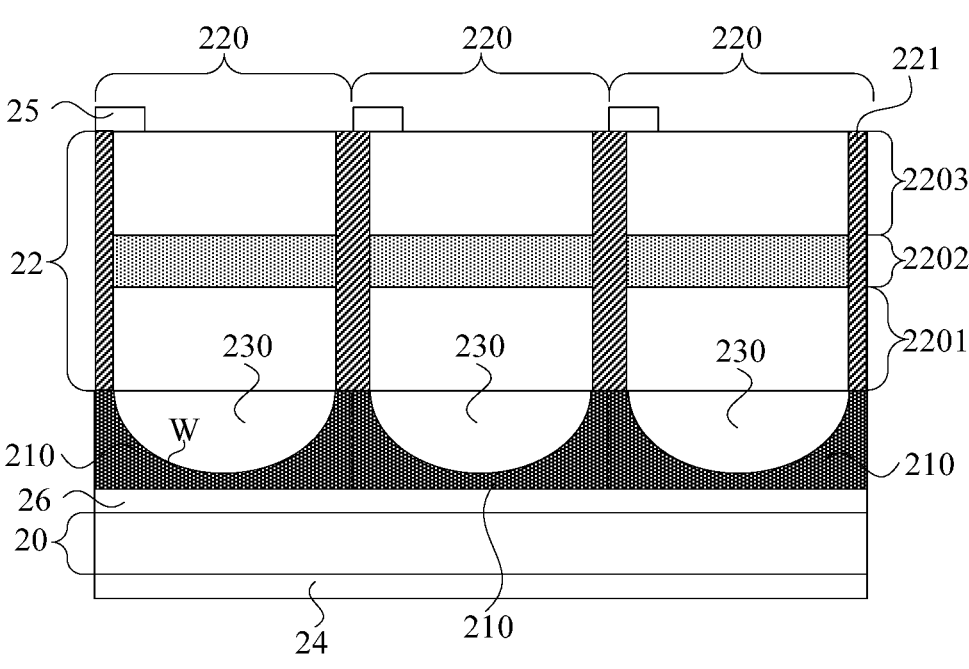
FIG. 6 is a schematic cross-sectional view of a light-emitting chip according to another embodiment of the present application.

Optionally, the reflector 210 may be an Ag layer configured to reflect light. Optionally, a Ni layer may be set on a side, close to the light-emitting pixel layer 22, of the Ag layer to reduce contact resistance. However, the present application is not limited thereto. In other embodiments, as shown in FIG. 6, FIG. 6 is a schematic cross-sectional view of a light-emitting chip according to another embodiment of the present application, only a first surface, close to the light-emitting pixel 220, of the reflector 210 is a bowl-shaped surface W, and a second surface, far from the light-emitting pixel 220, of the reflector 210 is a flat surface, so as to increase the front light exit rate of the light-emitting chip through the bowl-shaped surface W which is in a side, near the light-emitting pixel layer 22, of the reflector 210, and reduce a filling process between the reflectors 210 of two light-emitting pixels 220, thereby reducing the manufacturing difficulty of the light-emitting chip.

It should be noted that the second surface, away from the light-emitting pixel 220, of the reflector 210 is a flat surface, and the production process of the flat surface includes chemical mechanical polishing. Specifically, as shown in FIG. 6, a reflector 210 is formed on a side, away from the light-emitting pixel layer 22, of the bowl-shaped protrusion 230, and the reflector 210 further fills the gap space between the two reflectors 210 of the light-emitting pixel 220. Due to the shape of the bowl-shaped protrusion 230, the second surface, away from the light-emitting pixel 220, of the reflector 210 is uneven. Chemical mechanical polishing is used to make the second surface, away from the light-emitting pixel 220, of the reflector 210 be flat, in order to make the process of forming a bonding layer 26 or bonding the second surface to the first substrate 20 more convenient.

It should be noted that the other embodiments and drawings in the present application take both the upper and lower surfaces of the reflector 210 being a concave surface as an example for illustration, as shown in FIG. 5. Optionally, in other embodiments in the present application, a second surface, away from the light-emitting pixel 220, of the reflector 210 may be a flat surface to produce the light-emitting chip. In all embodiments of the present application, those skilled in the art can choose to manufacture a light-emitting chip based on actual needs using either the concave surfaces of both upper and lower surfaces of the reflector 210, as shown in FIG. 5, or using a concave surface on a side, close to the light-emitting pixel 220, of the reflector 210 and a flat surface on a side, away from the light-emitting pixel 220, of the reflector 210, as shown in FIG. 6.

In some embodiments of the present application, as shown in FIG. 2 to FIG. 6, the corresponding setting of the reflector 210 and the light-emitting pixel 220 includes a one-to-one corresponding setting of the reflector 210 and the light-emitting pixel 220, and an orthographic projection, on the first substrate, of one reflector 210 covers an orthographic projection, on the first substrate 21, of one light-emitting pixel 220.

Figure 7:
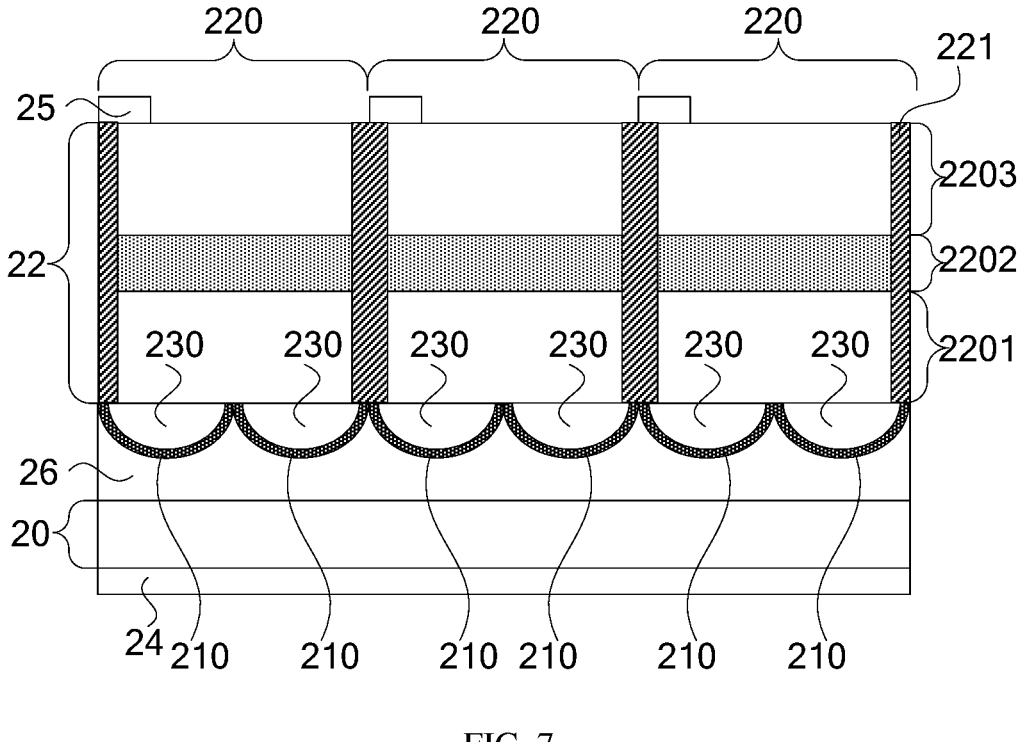
FIG. 7 is a schematic cross-sectional view of a light-emitting chip according to another embodiment of the present application.

However, the present application is not limited thereto, in other embodiments, as shown in FIG. 7, FIG. 7 is a schematic cross-sectional view of a light-emitting chip according to another embodiment of the present application. The corresponding setting of the reflector 210 and the light-emitting pixel 220 may also include a corresponding setting of a plurality reflectors 210 and one light-emitting pixel 220. Orthographic projections, on the first substrate 21, of the plurality of reflectors 210 cover an orthographic projection, on the first substrate 21, of the light-emitting pixel 220. This ensures that the reflector 210 may be configured to reflect light emitted by the corresponding light-emitting pixel 220, and adjust an emission direction and/or an emission angle of the light. The bowl-shaped surface of the reflector 210 has a focusing effect on the light emitted by the light-emitting pixel 220 toward the reflector 210, and reflects the light to the front of the light-emitting chip and then emits the light out, thereby improving the front light exit rate and the light-emitting brightness of the light-emitting chip.

It should be noted that as shown in FIG. 7, only indicates the corresponding settings of two reflectors 210 and one light-emitting pixel 220. Optionally, one light-emitting pixel 220 may also be arranged corresponding to N reflectors 210, N>2, N is an integer (not shown), as long as the reflectors 210 have a focusing effect on the light emitted by the light-emitting pixel 220 toward the reflectors 210.

In some embodiments of the present application, a side, facing the first substrate 20, of the light-emitting pixel layer 22 is provided with at least one bowl-shaped protrusion 230. The bowl-shaped protrusion 230 is protruded in a direction close to the first substrate 20, the bowl-shaped protrusion 230 is arranged corresponding to the reflector 210, and a shape of the bowl-shaped surface of the reflector 210 is consistent with that of the bowl-shaped protrusion 230.

Figure 8:
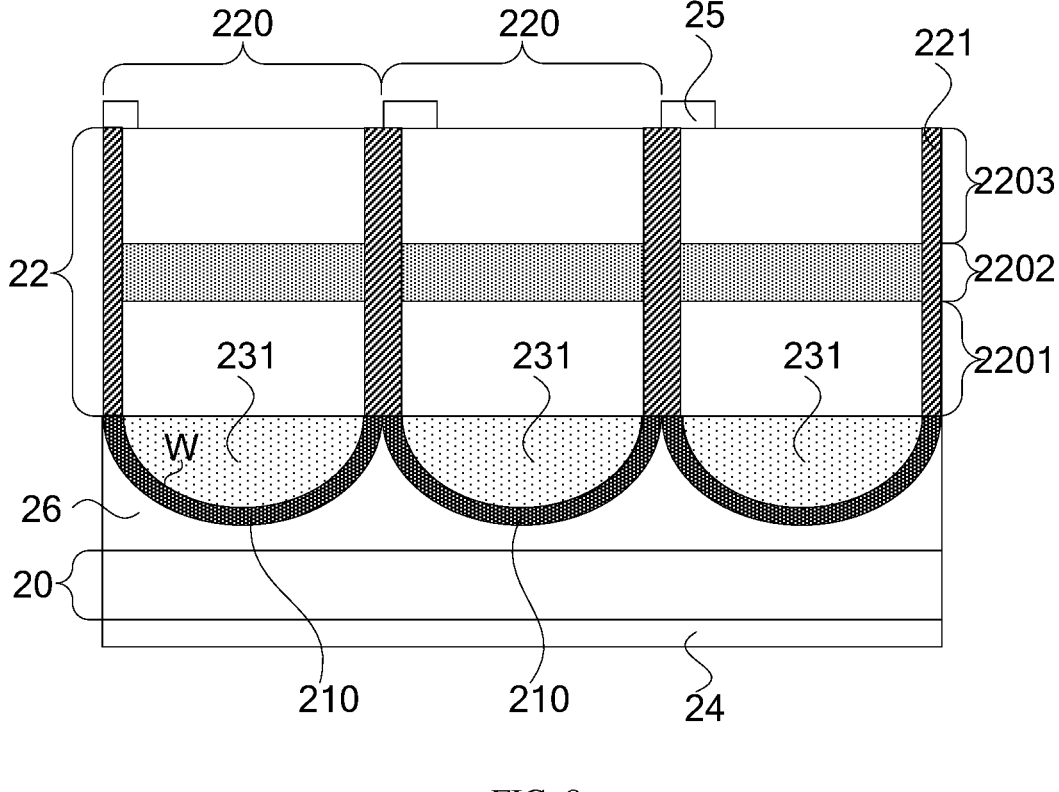
FIG. 8 is a schematic cross-sectional view of a light-emitting chip according to another embodiment of the present application.

In some embodiments, a material of the bowl-shaped protrusion 230 is different from that of the first semiconductor layer 2201. The material of the bowl-shaped protrusion 230 may be a transparent conductive material, such as Indium Tin Oxide (ITO). As shown in FIG. 8, FIG. 8 is a schematic cross-sectional view of a light-emitting chip according to another embodiment of the present application, a side, close to the first substrate 20, of the first semiconductor layer 2201 is provided with a transparent conductive layer. A material of the transparent conductive layer is a transparent conductive material, such as ITO. The transparent conductive layer is electrically connected to the first semiconductor layer 2201. The transparent conductive layer includes at least one first bowl-shaped protrusion 231 which is protruded toward the first substrate 20.

Optionally, the first bowl-shaped protrusion 231 may be a transparent conductive layer that may be formed using photolithography. The specific instructions for the photolithography process may be adopted the photolithography process steps used in other embodiments of the present application, which will not be repeated here.

It should be noted that, as shown in FIG. 8, a thickness of the first bowl-shaped protrusion 231 in a direction perpendicular to the first substrate 20 is hundreds of nanometers, and a thickness of the light-emitting pixel layer 22 in the direction perpendicular to the first substrate 20 is microns. However, the thickness and thickness ratio shown in the drawings do not represent the true thickness and thickness ratio of the first bowl-shaped protrusion 231 and the light-emitting pixel layer 22. Specifically, as shown in FIG. 8, the thickness of the first bowl-shaped protrusion 231 is greater than that of the light-emitting layer 2202. Optionally, the thickness of the first bowl-shaped protrusion 231 may be less than that of the light-emitting layer 2202. Those skilled in the art can choose appropriate thickness of the first bowl-shaped protrusion 231 and the light-emitting layer 2202 based on the requirements of the light-emitting chip.

It should be noted that in the present application, dimensions of various structures shown in the drawings do not represent the actual dimensions; the drawings are only for illustrating the relative positions of the various structures, and those skilled in the art may choose suitable dimensions to produce the various structures according to the actual dimensions required for the light-emitting chip. Specifically, the thickness of the first substrate 20 may be hundreds of microns, for example, it may be 725 μm, and the thickness of the light-emitting pixel layer 22 may be microns, for example, it may be 3 μm. As shown in FIG. 8, the thickness of the light-emitting pixel layer 22 in the direction perpendicular to the first substrate 20 is greater than that of the first substrate 20 in the direction perpendicular to the first substrate 20, which is only used for clearer illustration of the various structures of the light-emitting pixel layer 22 and is not a limitation on the thickness of the light-emitting pixel layer 22 and the first substrate 20.

In a process of manufacturing a light-emitting chip, a transparent conductive layer may be first formed on a surface of a first semiconductor layer 2201, and then at least one first bowl-shaped protrusion 231 may be formed by etching the transparent conductive layer, and then a reflector 210 is formed on a surface, away from the first semiconductor layer 2201, of the at least one first bowl-shaped protrusion 231, resulting in that a first surface, close to the light-emitting pixel 220, of the reflector 210 is a bowl-shaped surface W, and a shape of the bowl-shaped surface of the reflector 210 is consistent with that of the first bowl-shaped protrusion 231.

Figure 9:
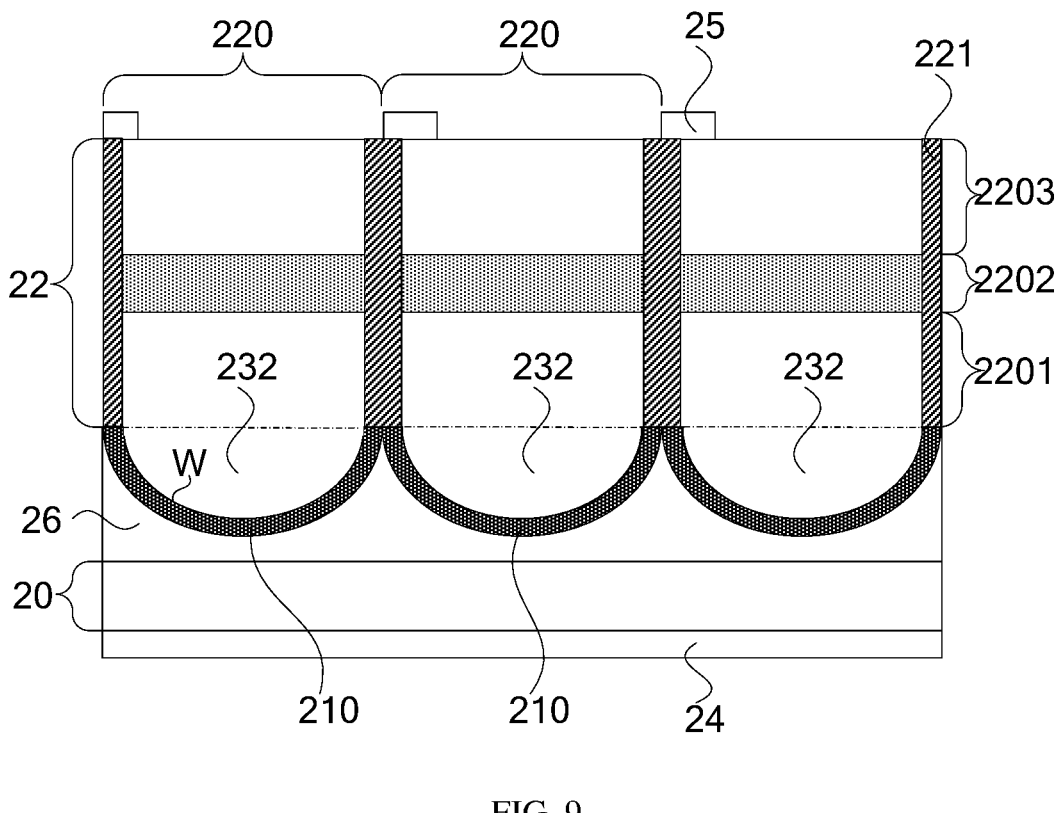
FIG. 9 is a schematic cross-sectional view of a light-emitting chip according to another embodiment of the present application.

In other embodiments, the material of the bowl-shaped protrusion 230 may be the same as that of the first semiconductor layer 2201. As shown in FIG. 9, FIG. 9 is a schematic cross-sectional view of a light-emitting chip according to another embodiment of the present application. The first semiconductor layer 2201 may include at least one second bowl-shaped protrusion 232. The second bowl-shaped protrusion 232 is located on a side, facing the first substrate 20, of the first semiconductor layer 2201, and the second bowl-shaped protrusion 232 is protruded toward the first substrate 20.

Optionally, the second bowl-shaped protrusion 232 is the first semiconductor layer 2201, and it may be formed by photolithography. The specific description of the photolithography process may be adopted from other embodiments used in the present application, and will not be repeated here.

In a process of manufacturing a light-emitting chips, a first semiconductor layer 2201 having at least one second bowl-shaped protrusion 232 may be first formed; and then at least one reflector 210 may be formed on a surface of the first semiconductor layer 2201. A first surface, close to the light-emitting pixel 220, of the reflector 210 is a bowl-shaped surface W, the shape of the bowl-shaped surface of the reflector 210 is consistent with that of the first bowl-shaped protrusion 231. The reflector 210 may be served as a transparent conductive layer to connect with the first semiconductor layer 2201. Alternatively, there may be a transparent conductive layer having a bowl-shaped structure between the reflector 210 and the second bowl-shaped protrusion 232, which is not described herein. Alternatively, there may be a Ni layer having a bowl-shaped structure between the reflector 210 and the second bowl-shaped protrusion 232 to reduce contact resistance, which is not described herein.

It should be noted that, the shape of the bowl-shaped surface of the reflector 210 is consistent with that of the first bowl-shaped protrusion 231 without limitation on the size of the shape. Optionally, other structures may exist between the reflector 210 and the bowl-shaped protrusion 230, resulting in a slightly greater radial length of the bowl-shaped surface of the reflector 210 than the radial length of the bowl-shaped protrusion 230. Therefore, this application does not limit thereto.

In some embodiments of the present application, as shown in FIG. 2 to FIG. 9, there is an isolation structure 221 between adjacent light-emitting pixels 220. The isolation structure 221 is configured to isolate the light of the adjacent light-emitting pixels 220 to avoid crosstalk between the adjacent light-emitting pixels 220.

The isolation structure 221 penetrates through the light-emitting pixel layer 22 and is arranged around the light-emitting pixel 220. In addition, a material of the isolation structure 221 may be insulating vinyl. In other embodiments, there may be no isolation structure between adjacent light-emitting pixels 220 if the light-emitting pixels 220 are not configured to display images but only configured to emit light, which will not be described herein.

In some embodiments of the present application, as shown in FIG. 2 to FIG. 9, there is a bonding layer 26 between the reflector 210 and the first substrate 20, and the light-emitting pixel layer 22 and the reflector 210 are bonded to the first substrate 20 through the bonding layer 26. The bonding layer 26 may be a metal bonding layer. Alternatively, when manufacturing the reflector 210, the reflector 210 is directly used to fill the gap between the bowl-shaped protrusions 230 of two light-emitting pixels 220, so that a second surface, away from the light-emitting pixel layer 22, of the reflector 210 is a flat surface. In other embodiments of the present application, the light-emitting pixel layer 22 and the reflector 210 may also be fixed on the first substrate 20 in other ways, which will not be repeated herein.

In some embodiments of the present application, the light-emitting chip further includes a first electrode 24 and a second electrode 25. The first electrode 24 is located on a side, away from the light-emitting pixel layer 22, of the reflector 210, and the second electrode 25 is located on a side, away from the first substrate 20, of the second semiconductor layer 2203. The first electrode 24 is electrically connected to the first semiconductor layer 2201, and the second electrode 25 is electrically connected to the second semiconductor layer 2203.

It should be noted that in some embodiments, the first electrode 24 and the second electrode 25 are respectively located on the upper and lower sides of the light-emitting pixel layer 22, which may be made into a light-emitting chip with a vertical structure. The embodiments do not limit the specific structure of the light-emitting chip.

In some embodiments, a driving circuit is formed on the first substrate 20, the first electrode 24 is located between the first substrate 20 and the light-emitting pixel layer 22 (not shown), and the driving circuit provides a driving signal for the first semiconductor layer 2201 through the first electrode 24. A film layer between the first electrode 24 and the first semiconductor layer 2201 is conductive film layer, so that the first electrode 24 may be electrically connected with the first semiconductor layer 2201 through the conductive film layer. The conductive film layer at least includes the reflector 210.

Figure 10:
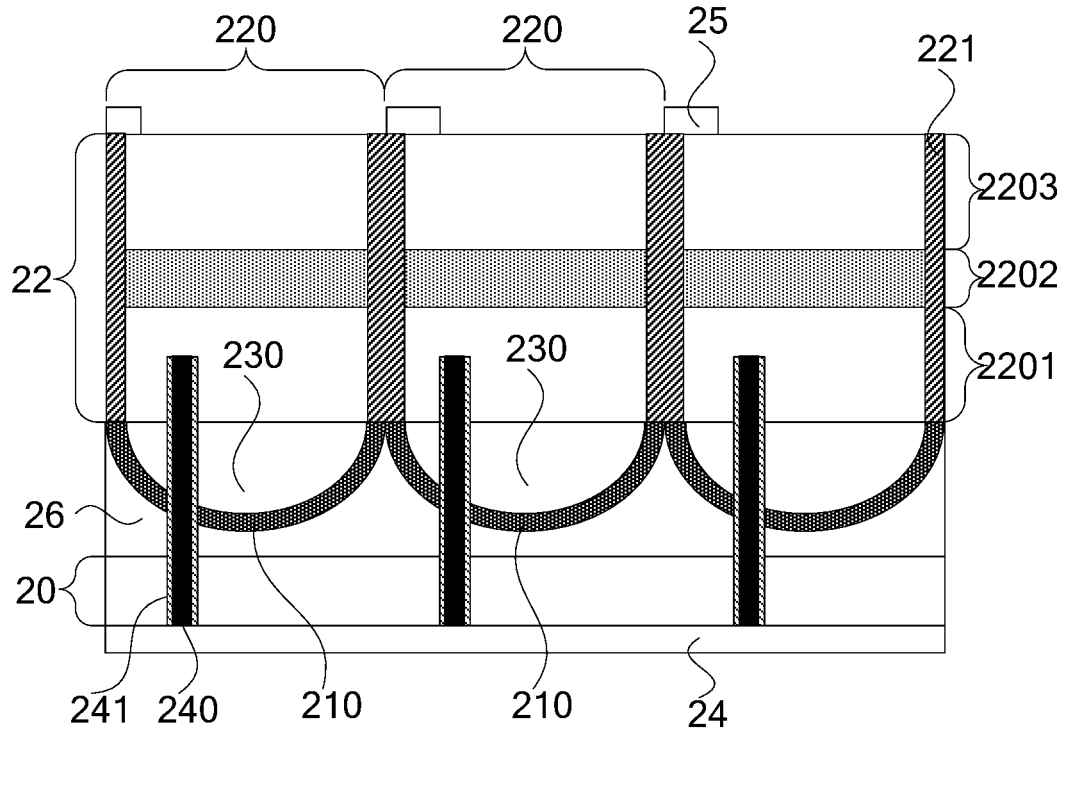
FIG. 10 is a schematic cross-sectional view of a light-emitting chip according to another embodiment of the present application.

Optionally, as shown in FIG. 10, FIG. 10 is a schematic cross-sectional view of a light-emitting chip according to another embodiment of the present application. A first electrode 24 is set on a side, away from the light-emitting pixel layer 22, of the first substrate 20. It should be noted that, the following embodiments and drawings take a scenario of setting the first electrode 24 on the side, away from the light-emitting pixel layer 22, of the first substrate 20 as an example, but there is no limitation to the position of the first electrode 24 in the present application. Film layers between the first electrode 24 and the first semiconductor layer 2201 are all conductive film layers, so that the first electrode 24 may be electrically connected with the first semiconductor layer 2201 through these conductive film layers, and the conductive film layers between the first electrode 24 and the first semiconductor layer 2201 at least include the first substrate 20 and the reflector 210. In a specific example, as shown in FIG. 8, the light-emitting chip may include a first substrate 20, a bonding layer 26, a reflector 210 and a first bowl-shaped protrusion 231. The bonding layer 26, the reflector 210 and the first bowl-shaped protrusion 231 may be made of metal, and the first substrate 20 may be a conductive substrate. The reflector 210 may be a conductive film layer, and a material of the reflector 210 may include Ni and Ag. For example, the reflector 210 includes at least two film layers disposed alternatively, and one film layer is made of Ni material, and the other film layer is made of Ag material.

However, this application is not limited thereto. In other embodiments, as shown in FIG. 10, the first electrode 24 may also be electrically connected with the first semiconductor layer 2201 through an electrical conductor (such as a via) 240. The electrical conductor penetrates film layers between the first electrode 24 and the first semiconductor layer 2201, and the film layers between the first electrode 24 and the first semiconductor layer 2201 may include a bowl-shaped protrusion 230, a reflector 210, a bonding layer 26 and a first substrate 20. Alternatively, the reflector 210 is not necessarily a conductive film layer, and it may be a DBR reflective layer.

It should be noted that after forming the light-emitting pixel layer 22, the bowl-shaped protrusion 230, the reflector 210, the bonding layer 26, and the first substrate 20, a via is formed by etching process, the via penetrates the bowl-shaped protrusion 230, the reflector 210, the bonding layer 26 and the first substrate 20, and at least partially penetrates the light-emitting pixel layer 22. A first insulating layer 241 and an electrical conductor 240 is formed in the via in sequence. The first electrode 24 is formed on a side, away from the light-emitting pixel layer 22, of the first substrate 20, and the electrical conductor 240 is electrically connected with the first semiconductor layer 2201 of the light-emitting pixel layer 22 and the first electrode 24. Alternatively, those skilled in the art can also use other processes to manufacture the electrical conductor 240, and the electrical conductor 240 is electrically connected with the first semiconductor layer 2201 of the light-emitting pixel layer 22 and the first electrode 24.

Figure 11:
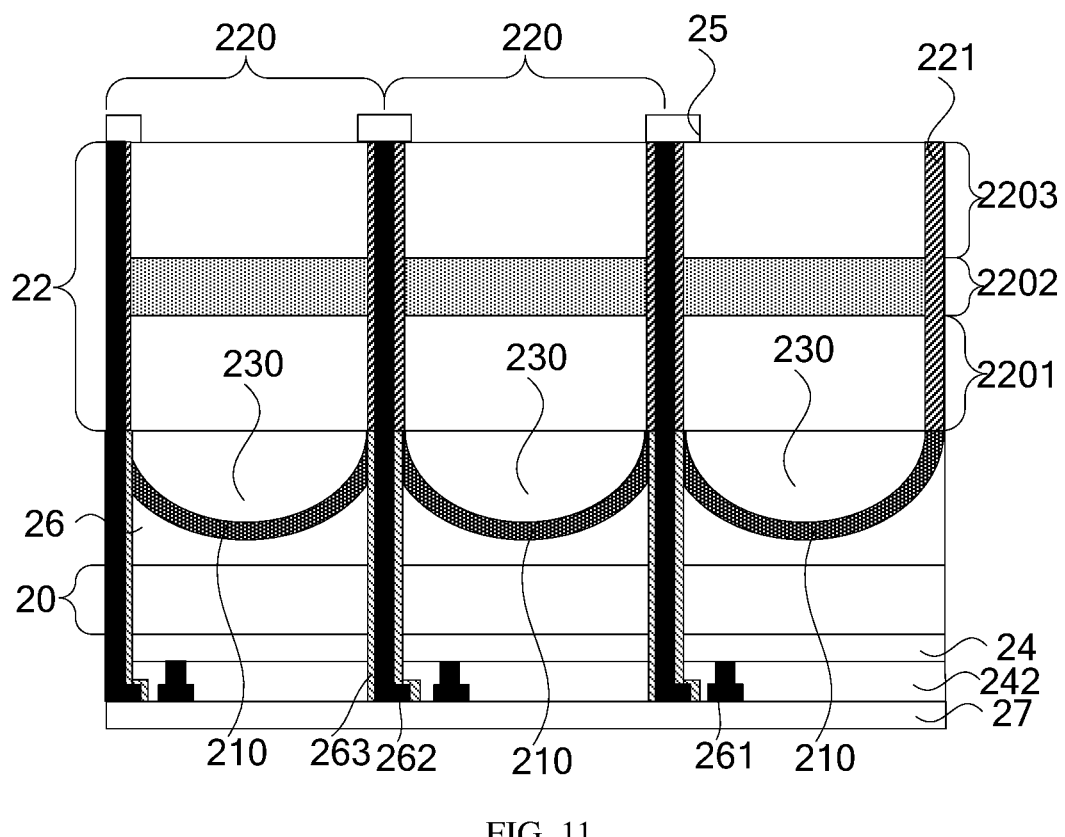
FIG. 11 is a schematic cross-sectional view of a light-emitting chip according to another embodiment of the present application.

On this basis, in some embodiments of the present application, as shown in FIG. 11, FIG. 11 is a schematic cross-sectional view of a light-emitting chip according to another embodiment of the present application. A driving circuit board 27 is formed on a side, away from a light-emitting pixel layer 22, of a first substrate 20. Specifically, the driving circuit board 27 is formed on a side, away from the light-emitting pixel layer 22, of a first electrode 24, and the driving circuit board 27 is provided with a driving circuit. The driving circuit board 27 is electrically connected with the first electrode 24 of a light-emitting pixel 220 through a first connector 261, and electrically connected with a second electrode 25 of the light-emitting pixel 220 through a second connector 262, so that the driving circuit is electrically connected with the first electrode 24 and the second electrode 25 respectively, and provides a driving signal to the first electrode 24 and the second electrode 25. The first connector 261 penetrates a film layer between the first electrode 24 and the driving circuit board 27, such as a second insulating layer 242. The second connector 262 penetrates film layers between the second electrode 25 and the driving circuit board 27, such as the light-emitting pixel layer 22, the reflector 210 and the first substrate 20.

In some embodiments of the present application, the second connector 262 is located inside an isolation structure 221, that is, the second connector 262 penetrates the isolation structure 221 and the film layer at the bottom thereof to be electrically connected with the driving circuit board 27. The second connector 262 is located inside the isolation structure 221, which does not occupy the light-emitting pixel layer 22, that is, which does not reduce the effective area of the light-emitting layer 2202, and may improve the light-emitting efficiency of the light-emitting chip.

It should also be noted that after forming the light-emitting pixel layer 22, the bowl-shaped protrusion 230, the reflector 210, the bonding layer 26, the first substrate 20, the first electrode 24 and the second insulating layer 242, a first via is formed by etching process, and the first via penetrates the second insulating layer 242. A first connector 261 is formed in the first via. A second via is formed by etching process, the second via penetrates the second insulating layer 242, the first electrode 24, the first substrate 20, the bonding layer 26, the reflector 210, the bowl-shaped protrusion 230 and the isolation structure 221, and at least a part of the third insulating layer 263 and the second connector 262 is formed in the second via in sequence. After that, a driving circuit board 27 is formed on a side, away from the first substrate 20, of the second insulating layer 242, so that the first connector 261 and the second connector 262 are electrically connected with the driving circuit of the driving circuit board 27. Alternatively, those skilled in the art can also use other processes to manufacture the first connector 261 and the second connector 262, which is not repeated herein.

Figure 12:
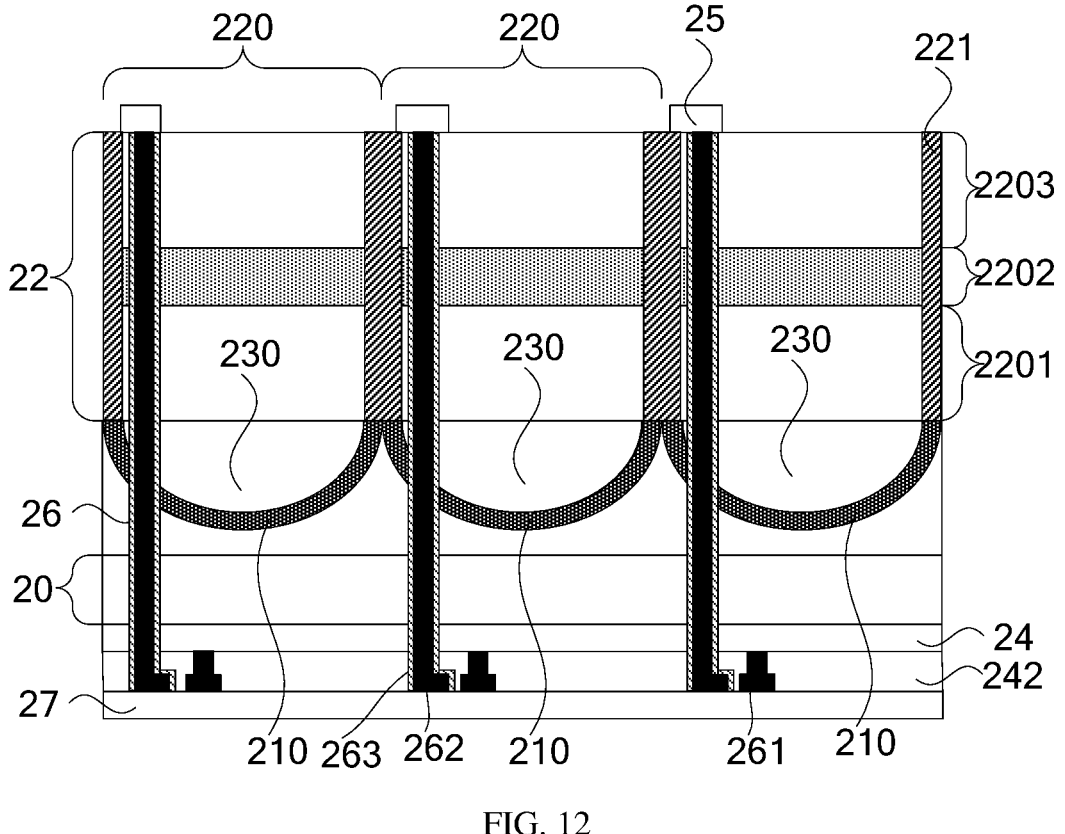
FIG. 12 is a schematic cross-sectional view of a light-emitting chip according to another embodiment of the present application.

Certainly, this application is not limited thereto. In other embodiments, as shown in FIG. 12, FIG. 12 is a schematic cross-sectional view of a light-emitting chip according to another embodiment of the present application, the second connector 262 may also be located outside the isolation structure 221, which is not repeated herein. There is a third insulating layer 263 around the second connector 262 to insulate the second connector 262 from other films.

It should also be noted that after forming the light-emitting pixel layer 22, the bowl-shaped protrusion 230, the reflector 210, the bonding layer 26, the first substrate 20, the first electrode 24 and the second insulating layer 242, a first via is formed by etching process, the first via penetrates the second insulating layer 242, and a first connector 261 is formed in the first via. A second via is formed by etching process, the second via penetrates the second insulating layer 242, the first electrode 24, the first substrate 20, the bonding layer 26, the reflector 210, the bowl-shaped protrusion 230 and the light-emitting pixel layer 22, and a third insulating layer 263 and a second connector 262 are formed in the second via in sequence. After that, a driving circuit board 27 is formed on a side, away from the first substrate 20, of the second insulating layer 242, so that the first connector 261 and the second connector 262 are electrically connected with the driving circuit of the driving circuit board 27. Alternatively, those skilled in the art can also use other processes to manufacture the first connector 261 and the second connector 262, which is not repeated herein.

Figure 13:
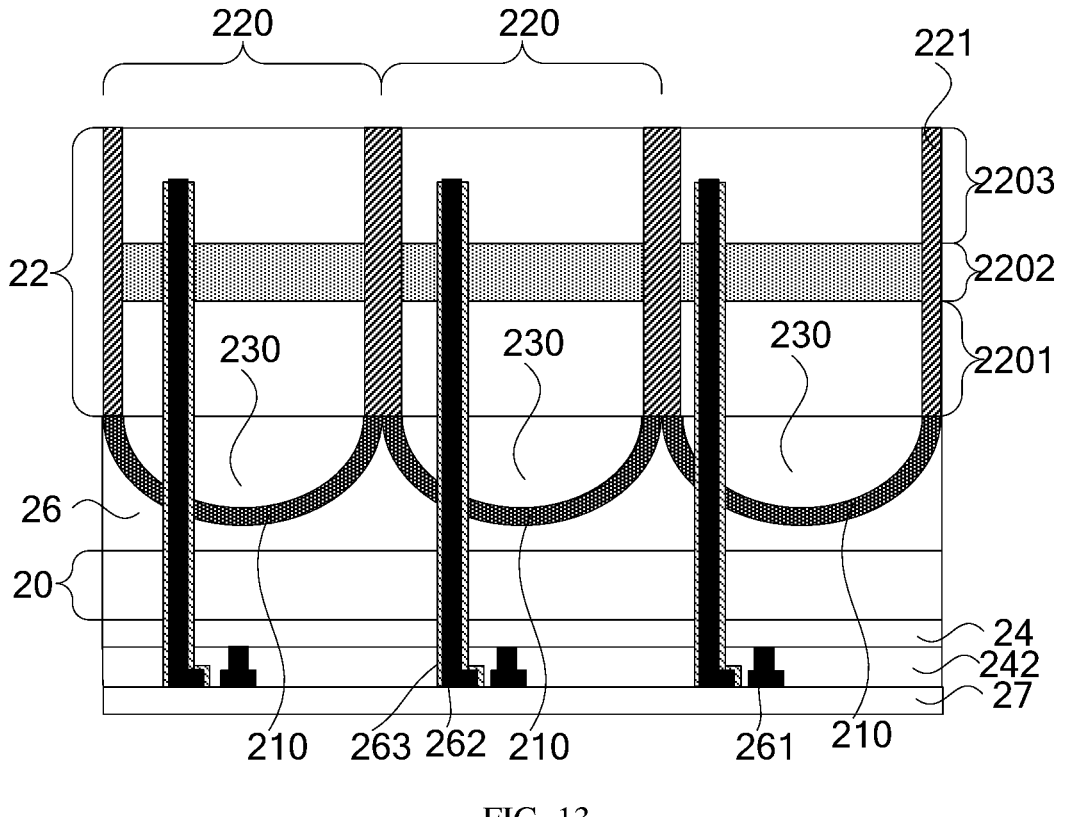
FIG. 13 is a schematic cross-sectional view of a light-emitting chip according to another embodiment of the present application.

It should be noted that, the embodiments and the drawings of the present application take only one setting mode of the first electrode and the second electrode as an example for illustration, but the present application is not limited thereto. For example, in other embodiments, the light-emitting chip may not include a second electrode. As shown in FIG. 13, FIG. 13 is a schematic cross-sectional view of a light-emitting chip according to another embodiment of the present application, the driving circuit board 27 may be directly electrically connected with the second semiconductor layer 2203 through the second connector 262, which is not repeated herein.

As an optional implementation of the present application, an embodiment of the present application provides a manufacturing method of a light-emitting chip, which is used for manufacturing the light-emitting chip according to any one of the above embodiments. As shown in FIG. 14 and FIG. 15 to FIG. 20, FIG. 14 is a flowchart of a manufacturing method of a light-emitting chip according to an embodiment of the present application. FIG. 15 to FIG. 20 are schematic cross-sectional views of a manufacturing process of a light-emitting chip according to an embodiment of the present application, and the manufacturing method includes the followings.

S101: Forming a light-emitting pixel layer on a second substrate, the light-emitting pixel layer including at least one light-emitting pixel.

In some embodiments of the present application, as shown in FIG. 15, the forming a light-emitting pixel layer 22 on a second substrate 30 includes: sequentially forming a second semiconductor layer 2203, a light-emitting layer 2202, and a first semiconductor layer 2201 on the second substrate 30, the light-emitting pixel layer 22 including at least one light-emitting pixel 220.

In some embodiments, the first semiconductor layer 2201, the light-emitting layer 2202 and the second semiconductor layer 2203 of the light-emitting pixel layer 22 may be made of GaN-based semiconductor material, and the specific growth process may include atomic layer deposition, chemical vapor deposition, molecular beam epitaxial growth, plasma-enhanced chemical vapor deposition, low-pressure chemical vapor deposition, metal-organic compound chemical vapor deposition, or their combinations.

S102: Forming at least one reflector 210 on a side, away from the second substrate 30, of the light-emitting pixel layer 22, the reflector 210 being arranged corresponding to the light-emitting pixel 220, and a first surface, close to the light-emitting pixel 220, of the reflector 210 is a bowl-shaped surface, the bowl-shaped surface being protruded in a direction away from the second substrate 30.

In some embodiments of the present application, the forming at least one reflector 210 on a side, away from the second substrate 30, of the light-emitting pixel layer 22 includes: forming at least one bowl-shaped protrusion 230 on the side, away from the second substrate 30, of the light-emitting pixel layer 22, the bowl-shaped protrusion 230 being protruded in a direction away from the second substrate 30; and forming the at least one reflector 210 on a surface of the at least one bowl-shaped protrusion 230, a shape of the bowl-shaped surface of the reflector 210 is consistent with that of the bowl-shaped protrusion 230.

Figure 16:
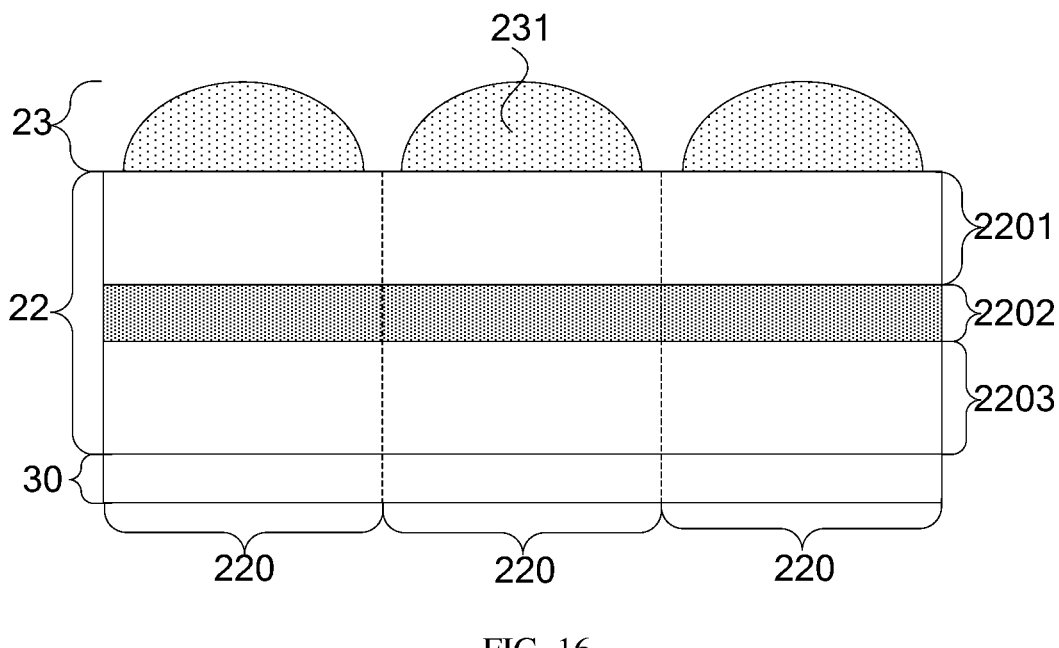

In some embodiments, as shown in FIG. 16, the forming at least one bowl-shaped protrusion 230 on a side, away from the second substrate 30, of the light-emitting pixel layer 22, includes: forming a transparent conductive layer 23 on the side, away from the second substrate 20, of the light-emitting pixel layer 22, and etching the transparent conductive layer 23, to form at least one first bowl-shaped protrusion 231.

Figure 17:
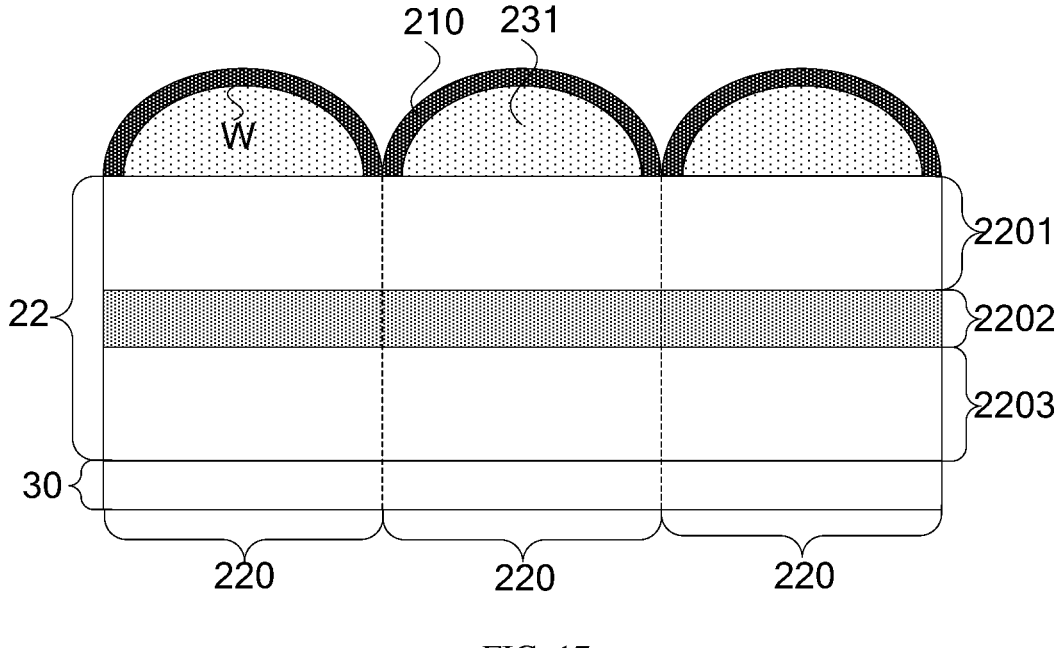

As shown in FIG. 17, the at least one reflector 210 is formed on the surface of at least one first bowl-shaped protrusion 231, and the reflector 210 is arranged corresponding to the light-emitting pixel 220, and the first surface, close to the light-emitting pixel 220, of the reflector 210 is a bowl-shaped surface, the bowl-shaped surface is protruded in the direction away from the second substrate 30. The shape of the bowl-shaped surface W is determined by the shape of the first bowl-shaped protrusion 231.

Figure 18:
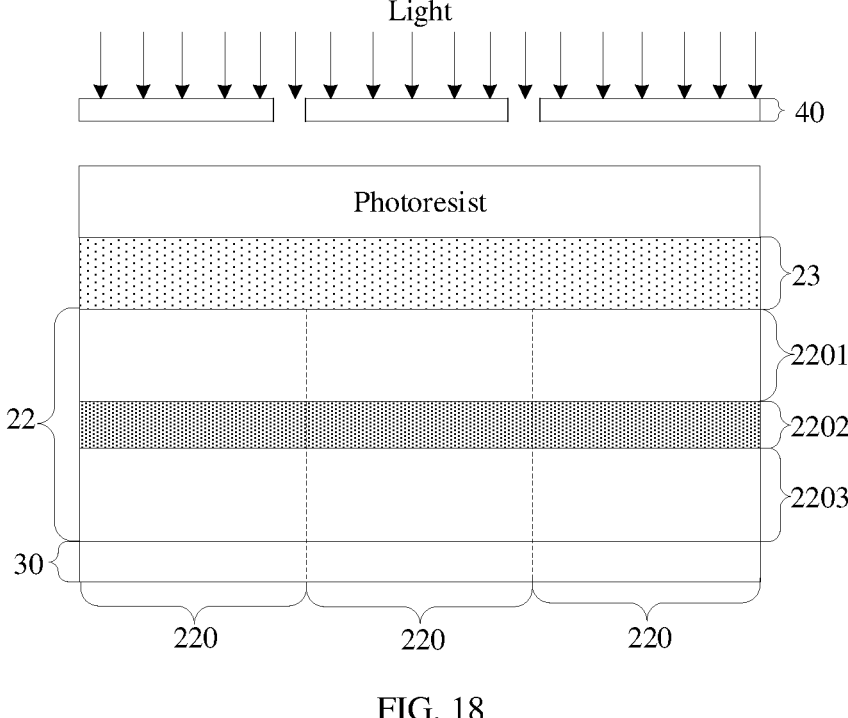
Figure 19:
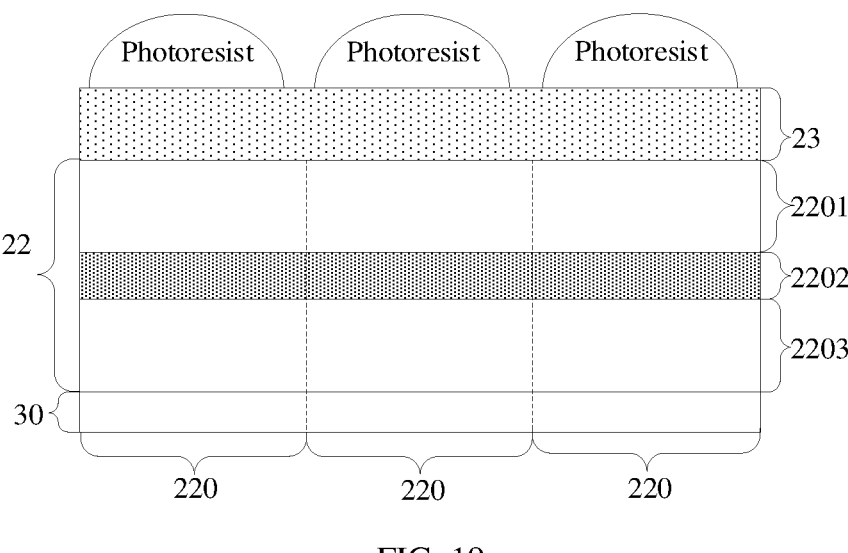

The process of etching the transparent conductive layer 23 may include: forming a photoresist layer on a surface of the transparent conductive layer 23, as shown in FIG. 18; then exposing the photoresist layer covered by a patterned mask 40 and developing it incompletely, so that the photoresist layer forms a yurt or a convex shape as shown in FIG. 19; and then, etching the transparent conductive layer 23 under the cover of the photoresist layer to copy the shape of the photoresist layer to form the at least one first bowl-shaped protrusion 231.

It should be noted that the photolithography process mentioned in this application can be the etching process using a photoresist layer mentioned in the above step S902, which will not be repeated in other embodiments.

S103: Transferring the light-emitting pixel layer 22 and the at least one reflector 210 onto a first substrate 20 and peeling off the second substrate 30.

The at least one reflector 210 and the light-emitting pixel layer 22 are sequentially located on the first substrate 20, and the light-emitting pixel 220 includes the first semiconductor layer 2201, the light-emitting layer 2202 and the second semiconductor layer 202 sequentially located on the first substrate 20. The bowl-shaped surface W is concave in a direction close to the first substrate 20. The reflector 210 is configured to reflect light emitted by a corresponding light-emitting pixel 220 and adjust an emission direction and/or an emission angle of the light.

Figure 20:
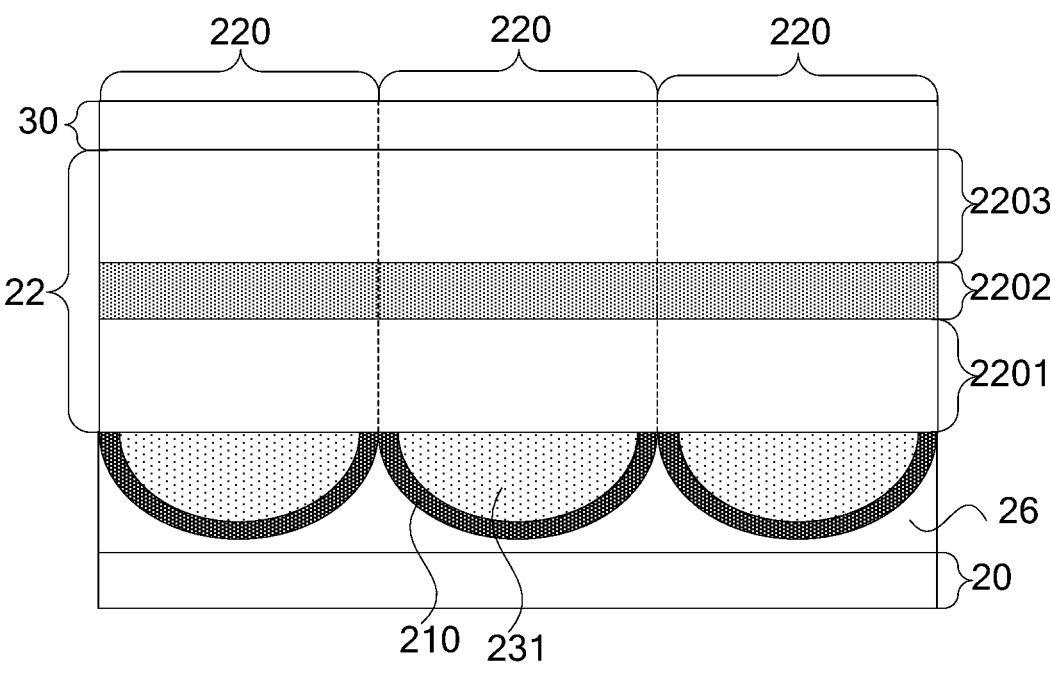

Specifically, as shown in FIG. 20, a bonding layer 26 may be formed on a side, away from the light-emitting pixel layer 22, of the reflector 210, and the light-emitting pixel layer 22 and the reflector 210 are transferred to the first substrate 20 through the bonding layer 26, and then the second substrate 30 is peeling off. Since the light-emitting pixel layer 22 and the reflector 210 are bonded on the first substrate 20 by flip-chip, the bonding layer 26, the reflector 210 and the light-emitting pixel layer 22 are sequentially located on the first substrate 20.

By adopting the manufacturing method according to the embodiment of the present application, a first surface, close to the light-emitting pixel, of the reflector 210 may be a bowl-shaped surface, and the bowl-shaped surface is concave in a direction close to the first substrate, therefore, not only will the small-angle light emitted by the light-emitting pixel 220 toward the reflector 210 be reflected to the front of the light-emitting chip by the reflector 210 and then emits out, but also the large-angle light emitted by the light-emitting pixel 220 toward the reflector 210 will be reflected to the front of the light-emitting chip by the reflector 210 and then emits out, thereby improving the front light exit rate and the light-emitting brightness of the light-emitting chip.

In other embodiments of the present application, the forming at least one bowl-shaped protrusion 230 on a side, away from the second substrate 30, of the light-emitting pixel layer 22 may include: etching the first semiconductor layer 2201 on the side, away from the second substrate 30, of the light-emitting pixel layer 22, to form at least one second bowl-shaped protrusion. The second bowl-shaped protrusion 232 is shown in FIG. 9.

The forming the reflector 210 on a side, away from the second substrate 30, of the light-emitting pixel layer 22 includes: forming the reflector 210 on the surface of the second bowl-shaped protrusion 232, so that the reflector 210 has a bowl-shaped surface W. The shape of the bowl-shaped surface W is determined by the shape of the second bowl-shaped protrusion 232.

The process of forming the second bowl-shaped protrusion and the reflector is similar to the above-mentioned process of forming the first bowl-shaped protrusion, which is not repeated herein. In the manufacturing method according to the embodiment of the present application, after transferring the light-emitting pixel layer and the reflector onto the first substrate, a first electrode, a second electrode, a driving circuit and the like may be formed, the forming process is the same as the existing forming process, which is not repeated herein.

Figure 21:
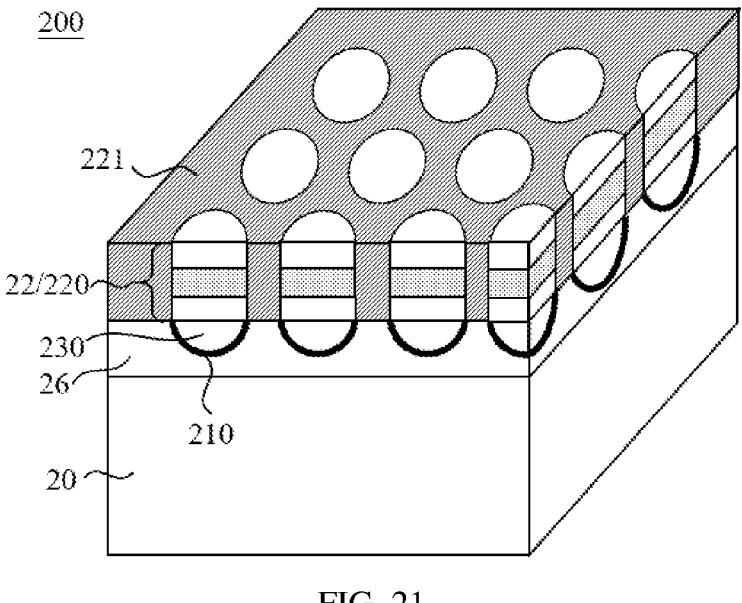
FIG. 21 is a schematic 3D structural diagram of a light-emitting chip according to an embodiment of the present application.

FIG. 21 is a schematic 3D structural diagram of a light-emitting chip according to an embodiment of the present application. As shown in FIG. 21, the embodiment of the present application shows that the light-emitting chip includes a first substrate 20, a bonding layer 26, a reflector 210, a bowl-shaped protrusion 230, a light-emitting pixel layer 22 sequentially stacked, and an isolation structure 221 between two light-emitting pixels 220.

It should be noted that FIG. 21 only illustrates that a projection, on the first substrate 20, of the light-emitting pixel layer 22 is circular, and the bowl-shaped surface of the bowl-shaped protrusion 230 is composed of arcs. In other embodiments, the bowl-shaped surface of the bowl-shaped protrusion 230 of the light-emitting chip may also be composed of a plurality of broken lines. In other embodiments, the projection, on the first substrate 20, of the light-emitting pixel layer 22 may be hexagonal, square or the like. Specifically, since FIG. 21 is a schematic 3D structural diagram with an oblique viewing angle, the projection, on the first substrate 20, of the light-emitting pixel layer 22 is an ellipse.

It should be noted that only 4×3 light-emitting pixels 220 are shown in FIG. 21, and the number of light-emitting pixels 220 included in the light-emitting chip is not limited in this application. The light-emitting pixels 220 located at the lowermost side and the rightmost side are cross-sectional structures for illustrating the light-emitting pixel layer 22, and the dimensions of the structures such as the light-emitting pixel layer 22 in the drawings are only used for illustrating the positional relationship, and do not represent the real dimensions of each structure of the light-emitting chip. Specifically, FIG. 21 only illustrates a matrix arrangement mode in which all light-emitting pixels 220 are aligned in the row and column direction. In an actual light-emitting chip structure, the light-emitting pixels 220 may be arranged in a staggered manner.

As an alternative implementation of the present application, an embodiment of the present application provides an electronic device including a light-emitting chip according to any one of the above embodiments. The electronic apparatus may be a Near-Eye Display (NED), or Augmented Reality (AR) glasses.

Figures 22, 23:
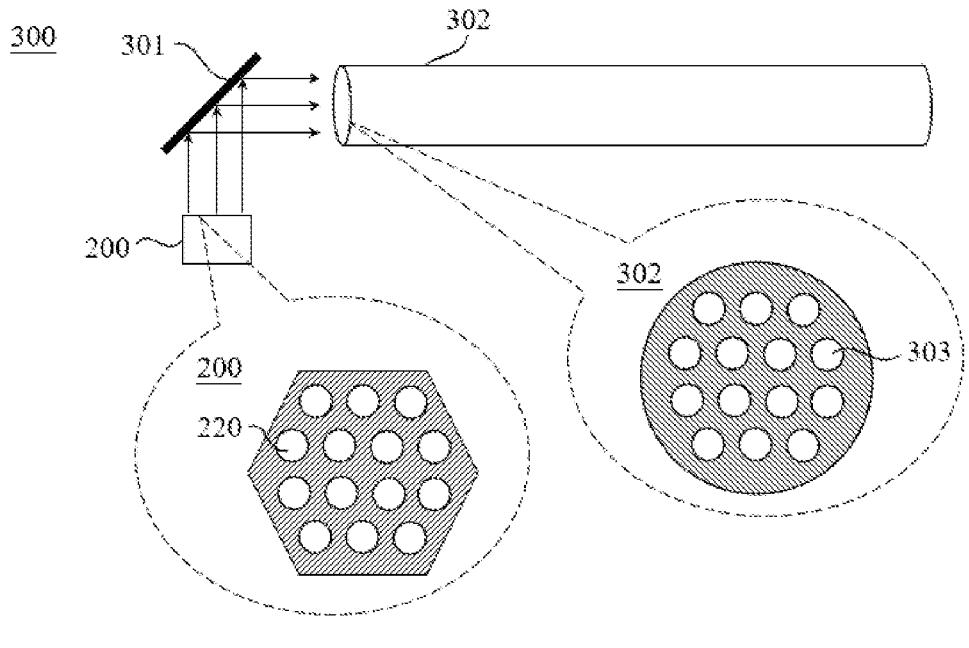
FIG. 22 is a schematic structural diagram of an electronic device according to an embodiment of the present application.
FIG. 23 is a schematic structural diagram of an electronic device according to another embodiment of the present application.

In one embodiment, as shown in FIG. 22, FIG. 22 is a structural schematic diagram of an electronic device according to an embodiment of the present application. The electronic device 300 includes a light-emitting chip 200 provided by other embodiments of the present application, a reflective structure 301 and an optical fiber structure 302. The reflective structure 301 redirects light emitted by the light-emitting chip 200 to the optical fiber structure 302, and the optical fiber structure 302 transmits light, thereby realizing optical communication.

Specifically, FIG. 22 shows that the electronic device 300 only includes one light-emitting chip 200, and one light-emitting chip 200 integrates 14 light-emitting pixels 220. Correspondingly, the optical fiber structure 302 includes 14 optical fibers 402. Optionally, the number and arrangement of the optical fibers 402 and the light-emitting pixels 220 are set correspondingly, to ensure that the light emitted by the light-emitting pixels 220 can be transmitted by the corresponding optical fibers 402, to realize a long-distance optical communication.

It should be noted that the light-emitting chip 200 may be provided with a certain number of light-emitting pixels 220, which can display different colors. The light-emitting pixels 220 can emit light with different light-emitting brightness by being adjusted the emission direction and/or emission angle of light by the reflector. The light-emitting chip 200 can emit light for displaying image information, and the light for displaying image information emitted by the light-emitting chip 200 is transmitted through the reflecting structure 301 and the optical fiber structure 302, to realize an optical communication that can display image information.

Optionally, as shown in FIG. 22, the cross-sectional shape of the light-emitting pixel 220 and the cross-sectional shape of the optical fiber 402 are circular, and the cross-sectional shapes of the light-emitting pixel 220 and the optical fiber 402 are not limited in this embodiment. It should be noted that the number and arrangement of the light-emitting pixels 220 included in the light-emitting chip 200 are not limited in this embodiment.

Optionally, as shown in FIG. 22, the cross-sectional shape of the light exit surface of the light-emitting chip 200 is hexagonal, and the cross-sectional shape of the optical fiber structure 302 is circular, and the cross-sectional shapes of the light-emitting chip 200 and the optical fiber structure 302 are not limited in this embodiment.

Optionally, as shown in FIG. 22, a coupling device may be added between the reflective structure 301 and the optical fiber structure 302 to guide the light reflected by the reflective structure 301 to the optical fiber structure 302.

In an embodiment, as shown in FIG. 23, FIG. 23 is a schematic structural diagram of an electronic device according to another embodiment of the present application. The electronic device 400 includes a light-emitting chip 200 provided by other embodiments of the present application, a grating structure 401 and an optical waveguide structure 402. The grating structure 401 couples the light emitted by the light-emitting chip 200 into the optical waveguide structure 402, the light is transmitted through the optical waveguide structure 402 and coupled out through the grating structure 401, and then received by human eyes, thus realizing the augmented reality HCI (Human-Computer Interaction) technology.

It should be noted that FIG. 23 shows that the electronic device 400 only includes one light-emitting chip 200, and one light-emitting chip 200 integrates 14 light-emitting pixels 220. The light-emitting chip 200 may be provided with a certain number of light-emitting pixels 220, which may display different colors. The light-emitting pixels 220 may emit light with different light-emitting brightness by being adjusted the emission direction and/or emission angle of light by the reflector. The light-emitting chip 200 may emit light for displaying image information; and the light, for displaying image information, emitted by the light-emitting chip 200 is transmitted through the grating structure 401 and the optical waveguide structure 402, to realize the AR technology that can display image information.

Optionally, as shown in FIG. 23, the cross-sectional shape of the light exit surface of the light-emitting chip 200 is hexagonal, and the cross-sectional shape of the light-emitting pixel 220 is circular. The cross-sectional shapes of the light-emitting pixels 220 and the light-emitting chip 200 are not limited in this embodiment, and the number and arrangement of the light-emitting pixels 220 included in the light-emitting chip 200 are not limited in this embodiment.

It should be noted that the electronic device 400 shown in FIG. 23 does not include human eyes, and the human eyes are only used to indicate that the electronic device 400 may be used for AR technology.

Figure 24:
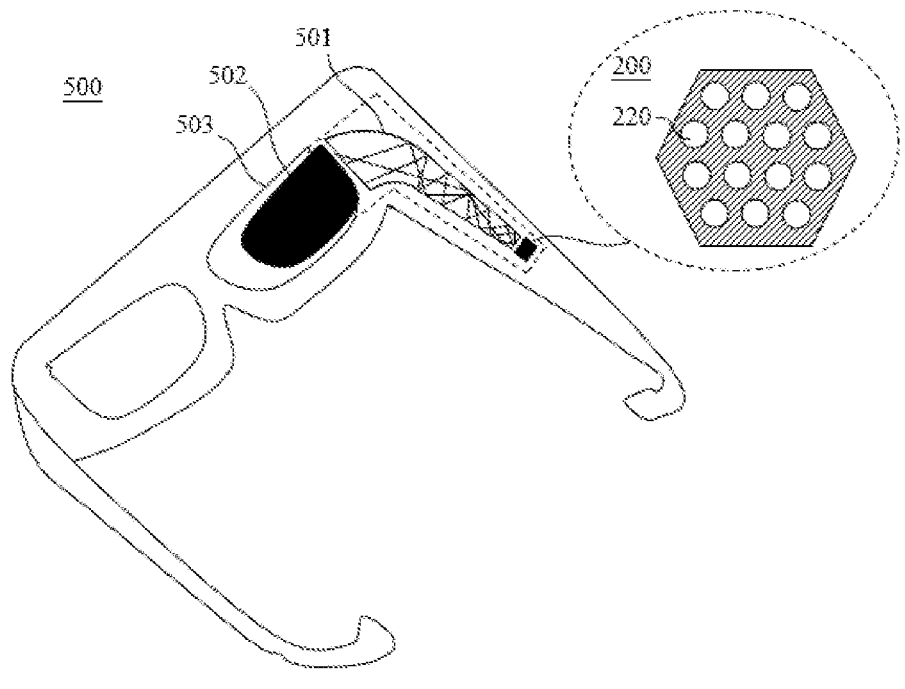
FIG. 24 is a schematic structural diagram of an electronic device according to another embodiment of the present application.

In one embodiment, as shown in FIG. 24, FIG. 24 is a schematic structural diagram of an electronic device according to another embodiment of the present application. The electronic device 500 includes a light-emitting chip 200 provided by other embodiments of the present application, an optical waveguide structure 501, a virtual image display member 502 and a perspective member 503. The optical waveguide structure 501 transmits the light emitted by the light-emitting chip 200 to the virtual image display member 502. The perspective member 503 may be configured to transmit the light of real world. By combining the virtual image display member 502 and the perspective member 503, human eyes may receive the image information projected from the virtual image to the real world, thus enhancing the virtual reality feeling.

It should be noted that FIG. 24 shows that the electronic device 400 only includes one light-emitting chip 200, and one light-emitting chip 200 integrates 14 light-emitting pixels 220. The light-emitting chip 200 may be provided with a certain number of light-emitting pixels 220, which can display different colors, and the light-emitting pixel 220 may emit light with different light-emitting brightness by being adjusted the emission direction and/or emission angle of light by the reflector. The light-emitting chip 200 may emit light for displaying image information, and the light, for displaying image information, emitted by the light-emitting chip 200 is transmitted through the optical waveguide structure 501 and the virtual image display member 502, and the light of real-world is transmitted by the perspective member 503, the human eye may ultimately receive the image information projected from the virtual image to the real world, thus enhancing the virtual reality feeling.

Optionally, as shown in FIG. 24, the cross-sectional shape of the light exit surface of the light-emitting chip 200 is hexagonal, and the cross-sectional shape of the light-emitting pixel 220 is circular. The cross-sectional shapes of the light-emitting pixels 220 and the light-emitting chip 200 are not limited in this embodiment, and the number and arrangement of the light-emitting pixels 220 included in the light-emitting chip 200 are not limited in this embodiment.

Optionally, as shown in FIG. 24, the electronic device 500 is made into glasses, which is convenient to use and carry.

The present application provides a light-emitting chip, a manufacturing method thereof and an electronic device. The light-emitting chip includes a first substrate; and at least one reflector and a light-emitting pixel layer sequentially located on the first substrate. The light-emitting pixel layer includes at least one light-emitting pixel. The reflector is arranged corresponding to the light-emitting pixel, a first surface, close to the light-emitting pixel, of the reflector is a bowl-shaped surface, and the bowl-shaped surface is concave in a direction close to the first substrate, therefore, the bowl-shaped surface of the reflector is able to reflect the light emitted by the light-emitting pixel, and adjust the emission direction and/or emission angle of the light, so that the light exit rate of the light-emitting chip may be improved, and the light-emitting brightness of the light-emitting chip and electronic device may be further improved.

The various embodiments in this specification are described in a progressive way, and each embodiment focuses on the differences from other embodiments, and the same and similar parts among the embodiments may only be referred to each other. As for the device disclosed in the embodiment, because it corresponds to the method disclosed in the embodiment, the description is relatively simple, and the relevant points may be described in the method part.

The above description of the disclosed embodiments enables those skilled in the art to make or use this application. Many modifications to these embodiments will be obvious to those skilled in the art, and the general principles defined herein can be implemented in other embodiments without departing from the spirit or scope of this application. Therefore, this application will not be limited to the embodiments shown herein, but is to be accorded the widest scope consistent with the principles and novel features disclosed herein.

What is claimed is:

1. A light-emitting chip, comprising:
   a first substrate; and
   at least one reflector and a light-emitting pixel layer sequentially located on the first substrate;
   wherein the light-emitting pixel layer comprises at least one light-emitting pixel; the light-emitting pixel comprises a first semiconductor layer, a light-emitting layer and a second semiconductor layer sequentially located on the first substrate; the reflector is arranged corresponding to the light-emitting pixel;
   a first surface, close to the light-emitting pixel, of the reflector is a bowl-shaped surface, the bowl-shaped surface is concave in a direction close to the first substrate; the reflector is configured to reflect light emitted by a corresponding light-emitting pixel and adjust an emission direction and/or an emission angle of the light;
   the light-emitting chip further comprises a first electrode and a second electrode;
   the first electrode is located on a side, away from the light-emitting pixel layer, of the reflector, and the first electrode is electrically connected with the first semiconductor layer;
   the second electrode is located on a side, away from the first substrate, of the second semiconductor layer, and the second electrode is electrically connected with the second semiconductor layer;
   a side, away from the light-emitting pixel layer, of the first electrode is provided with a driving circuit board;
   the first electrode is electrically connected with the driving circuit board through a first connector; the first connector penetrates a film layer between the first electrode and the driving circuit board; and
   the second electrode is electrically connected with the driving circuit board through a second connector; the second connector penetrates a film layer between the second electrode and the driving circuit board.

2. The light-emitting chip according to claim 1, wherein the first surface close to the light-emitting pixel and a second surface away from the light-emitting pixel of the reflector are bowl-shaped surfaces, and the reflector is configured as a bowl-shaped structure.

3. The light-emitting chip according to claim 1, wherein a second surface, away from the light-emitting pixel, of the reflector is a flat surface.

4. The light-emitting chip according to claim 1, wherein a side, facing the first substrate, of the light-emitting pixel layer is provided with at least one bowl-shaped protrusion;
   the bowl-shaped protrusion is protruded in a direction close to the first substrate; and the bowl-shaped protrusion is arranged corresponding to the reflector, and a shape of the bowl-shaped surface of the reflector is consistent with that of the bowl-shaped protrusion.

5. The light-emitting chip according to claim 4, wherein a material of the bowl-shaped protrusion is the same as that of the first semiconductor layer.

6. The light-emitting chip according to claim 4, wherein a material of the bowl-shaped protrusion is a transparent conductive material.

7. The light-emitting chip according to claim 1, wherein a film layer between the first electrode and the first semiconductor layer is a conductive film layer, and the first electrode is electrically connected with the first semiconductor layer through the conductive film layer; the conductive film layer at least comprises the reflector.

8. The light-emitting chip according to claim 1, wherein the first electrode is electrically connected with the first semiconductor layer through an electrical conductor, the electrical conductor penetrates a film layer between the first electrode and the first semiconductor layer.

9. The light-emitting chip according to claim 1, wherein an isolation structure is provided between adjacent light-emitting pixels, and the isolation structure is configured to isolate light of the adjacent light-emitting pixels.

10. The light-emitting chip according to claim 9, wherein the second connector is located inside the isolation structure, and the second connector is configured to realize electrical connection between the second electrode of the light-emitting pixel and the driving circuit board.

11. The light-emitting chip according to claim 1, wherein the reflector is arranged in one-to-one correspondence with the light-emitting pixel, and an orthographic projection, on the first substrate, of one reflector covers an orthographic projection, on the first substrate, of one light-emitting pixel.

12. The light-emitting chip according to claim 1, wherein a plurality of reflectors are arranged corresponding to one light-emitting pixel, and orthographic projections, on the first substrate, of the plurality of reflectors cover an orthographic projection, on the first substrate, of one light-emitting pixel.

13. A manufacturing method of a light-emitting chip, comprising:

forming a light-emitting pixel layer on a second substrate, the light-emitting pixel layer comprising at least one light-emitting pixel, and the light-emitting pixel comprising a second semiconductor layer, a light-emitting layer and a first semiconductor layer sequentially located on the second substrate;

forming at least one reflector on a side, away from the second substrate, of the light-emitting pixel layer, the reflector being arranged corresponding to the light-emitting pixel, and a first surface, close to the light-emitting pixel, of the reflector being a bowl-shaped surface, the bowl-shaped surface being protruded in a direction away from the second substrate; and transferring the light-emitting pixel layer and the at least one reflector onto a first substrate and peeling off the second substrate, wherein the at least one reflector and the light-emitting pixel layer are sequentially located on the first substrate, and the light-emitting pixel comprises the first semiconductor layer, the light-emitting layer and the second semiconductor layer sequentially located on the first substrate, the bowl-shaped surface is concave in a direction close to the first substrate; the reflector is configured to reflect light emitted by a corresponding light-emitting pixel and adjust an emission direction and/or an emission angle of the light, wherein the manufacturing method further comprises forming a first electrode, a second electrode and a driving circuit board;

the first electrode is located on a side, away from the light-emitting pixel layer, of the reflector, and the first electrode is electrically connected with the first semiconductor layer;

the second electrode is located on a side, away from the first substrate, of the second semiconductor layer, and the second electrode is electrically connected with the second semiconductor layer;

a side, away from the light-emitting pixel layer, of the first electrode is provided with the driving circuit board;

the first electrode is electrically connected with the driving circuit board through a first connector; the first connector penetrates a film layer between the first electrode and the driving circuit board; and the second electrode is electrically connected with the driving circuit board through a second connector; the second connector penetrates a film layer between the second electrode and the driving circuit board.

14. The manufacturing method of the light-emitting chip according to claim 13, wherein the forming at least one reflector on a side, away from the second substrate, of the light-emitting pixel layer comprises:

forming at least one bowl-shaped protrusion on the side, away from the second substrate, of the light-emitting pixel layer, the bowl-shaped protrusion being protruded in a direction away from the second substrate; and forming the at least one reflector on a surface of the at least one bowl-shaped protrusion, and a shape of the bowl-shaped surface of the reflector is consistent with that of the bowl-shaped protrusion.

15. The manufacturing method of the light-emitting chip according to claim 14, wherein the forming at least one bowl-shaped protrusion on a side, away from the second substrate, of the light-emitting pixel layer comprises:

forming a transparent conductive layer on the side, away from the second substrate, of the light-emitting pixel layer, and etching the transparent conductive layer, to form at least one first bowl-shaped protrusion.

16. The manufacturing method of the light-emitting chip according to claim 14, wherein the forming at least one bowl-shaped protrusion on a side, away from the second substrate, of the light-emitting pixel layer comprises:

etching the first semiconductor layer on the side, away from the second substrate, of the light-emitting pixel layer, to form at least one second bowl-shaped protrusion.

17. An electronic device, comprising the light-emitting chip according to claim 1.

18. The electronic device according to claim 17, wherein the electronic device comprises a near-eye display device, and the near-eye display device comprises a near-eye display or augmented reality glasses.

* * * * *